US012765353B2

(12) United States Patent
Wu et al.

(10) Patent No.: US 12,765,353 B2
(45) Date of Patent: Oct. 13, 2026

(54) THREE DIMENSIONAL (3D) MEMORY DEVICE AND FABRICATION METHOD

(71) Applicant: Yangtze Memory Technologies Co., Ltd., Wuhan (CN)

(72) Inventors: Linchun Wu, Wuhan (CN); Wenxi Zhou, Wuhan (CN); Cuicui Kong, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 796 days.

(21) Appl. No.: 17/990,404

(22) Filed: Nov. 18, 2022

(65) Prior Publication Data

US 2024/0170393 A1 May 23, 2024

(51) Int. Cl.

| | |
|---|---|
| ***H10W 20/42*** | (2026.01) |
| ***G11C 16/04*** | (2006.01) |
| ***H10B 43/10*** | (2023.01) |
| ***H10B 43/27*** | (2023.01) |
| ***H10B 43/40*** | (2023.01) |
| ***H10W 20/41*** | (2026.01) |
| *H10W 80/00* | (2026.01) |
| *H10W 90/00* | (2026.01) |

(52) U.S. Cl.

CPC ......... *H10W 20/42* (2026.01); *G11C 16/0483* (2013.01); *H10B 43/10* (2023.02); *H10B 43/27* (2023.02); *H10B 43/40* (2023.02); *H10W 20/435* (2026.01); *H10W 80/312* (2026.01); *H10W 80/327* (2026.01); *H10W 90/792* (2026.01)

(58) Field of Classification Search

CPC . H01L 23/5226; H01L 23/5283; H01L 24/08; H01L 24/80; H01L 2224/08145; H01L 2224/80895; H01L 2224/80896; H01L 2924/1431; G11C 16/0483; H10W 20/42; H10W 20/435; H10W 80/312; H10W 80/327; H10W 90/792; H10B 43/50; H10B 43/10; H10B 43/27; H10B 43/40; H10B 41/27

See application file for complete search history.

(56) References Cited

U.S. PATENT DOCUMENTS

| | | | | |
|---|---|---|---|---|
| 2019/0341399 A1* | 11/2019 | Tao | | H01L 23/5226 |
| 2021/0036001 A1* | 2/2021 | Kim | | H10B 41/27 |
| 2021/0366808 A1* | 11/2021 | Cui | | H10B 41/10 |
| 2021/0366920 A1* | 11/2021 | Tokita | | H10D 84/038 |
| 2022/0254727 A1* | 8/2022 | Greenlee | | H01L 23/562 |
| 2023/0084497 A1* | 3/2023 | Kim | | H01L 25/0657 438/107 |

* cited by examiner

*Primary Examiner* — Jessica S Manno
*Assistant Examiner* — Bipana Adhikari Dawadi
(74) *Attorney, Agent, or Firm* — Anova Law Group, PLLC

(57) ABSTRACT

A 3D memory device includes a conductor/insulator stack, a channel hole structure extending through the conductor/insulator stack, and a staircase contact (SCT). The conductor/insulator stack includes a first conductive layer and a first dielectric layer alternatingly stacked. The SCT includes a conductive structure, extends through the first dielectric layer, contacts a second dielectric layer, and is electrically connected to the first conductive layer. The second dielectric layer is parallel to the first conductive layer.

20 Claims, 20 Drawing Sheets

THREE DIMENSIONAL (3D) MEMORY DEVICE AND FABRICATION METHOD

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

A staircase contact (SCT) is a structure used to contact a word line in some NAND memory devices. Improvements of the process to fabricate SCTs for NAND memory devices are desirable.

SUMMARY

In one aspect of the present disclosure, a 3D memory device includes a conductor/insulator stack containing a first conductive layer and a first dielectric layer alternatingly stacked, a channel hole structure extending through the conductor/insulator stack, a staircase contact (SCT), and a second dielectric layer. The SCT includes a conductive structure, extends through the first dielectric layer, and is electrically connected to the first conductive layer. The second dielectric layer is parallel to the first conductive layer. The SCT contacts the second dielectric layer.

In another aspect of the present disclosure, a method for fabricating a 3D memory device includes forming a dielectric stack that has a first dielectric layer and a second dielectric layer alternately stacked, forming a channel hole structure through the dielectric stack, removing a first portion of the first dielectric layer to form a first cavity, filling the first cavity with a first filling structure, removing a second portion of the first dielectric layer to form a second cavity in which the channel hole structure is exposed, removing the first filling structure, forming a combined cavity including the first and second cavities, and depositing a first conductive material in the combined cavity to form a conductive layer. The combined cavity extends from the channel hole structure to a bottom of a first opening for a staircase contact (SCT). The conductive layer extends from the channel hole structure to the bottom of the first opening.

In another aspect of the present disclosure, a system includes a memory device, and a memory controller for controlling the memory device. The memory device includes a conductor/insulator stack containing a first conductive layer and a first dielectric layer alternatingly stacked, a channel hole structure extending through the conductor/insulator stack, a staircase contact (SCT), and a second dielectric layer. The SCT includes a conductive structure, extends through the first dielectric layer, and is electrically connected to the first conductive layer. The second dielectric layer is parallel to the first conductive layer. The SCT contacts the second dielectric layer.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-29 schematically show a fabrication process of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane or along a line in the X-Y plane.

Figure 1:
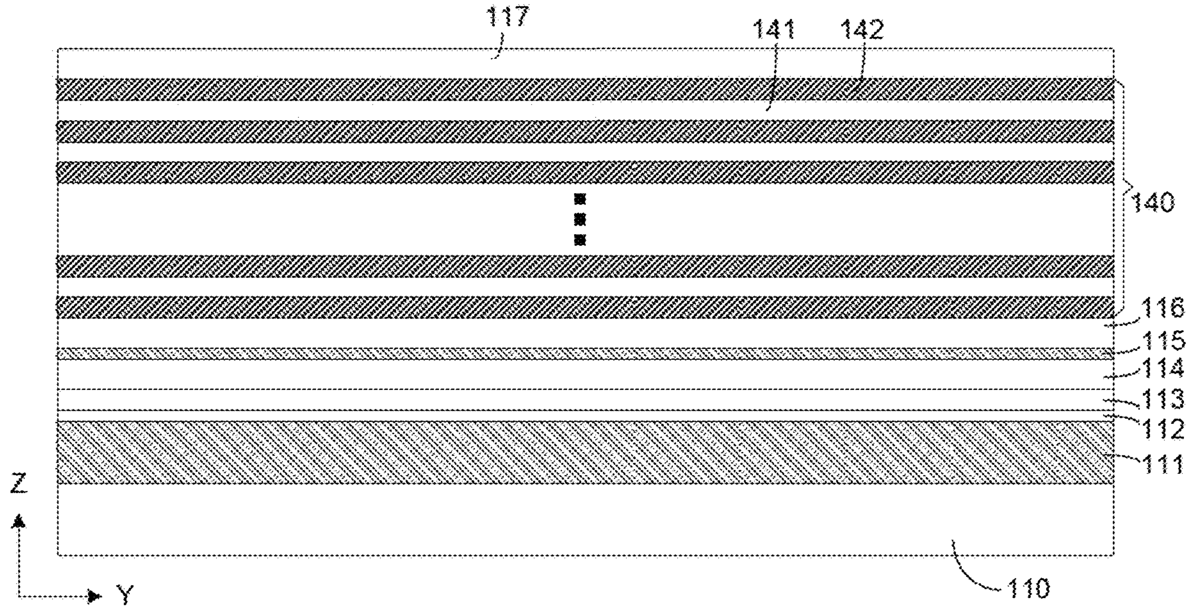
FIG. 1 illustrates a cross-sectional view of a structure of an exemplary three-dimensional (3D) array device at a certain stage during a fabrication process according to various aspects of the present disclosure.

As shown in FIG. 1, a structure of the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, layers 111-116 are deposited over the substrate 110 by chemical vapor deposition (CVD), physical vapor deposition (PVD), atomic layer deposition (ALD), or a combination thereof. The layers 111 and 115 are undoped or lightly doped polysilicon layers. The layers 112, 114 and 116 are silicon oxide layers. The layer 113 may be another silicon oxide layer in some cases. Optionally, the layer 113 may be a layer of another material such as aluminum oxide.

Further, a dielectric stack 140 is formed over the substrate 110 or silicon oxide layer 116, and a dielectric layer 117 is formed over the dielectric stack 140. The layer 117 may include silicon oxide. The dielectric stack 140 may be considered as a dielectric stack structure that includes multiple pairs of stack layers, for example, including first dielectric layers 141 and second dielectric layers 142, stacked alternately over each other. Some layers of the dielectric stack 140 are used to form memory cells. In some cases, the layers for fabricating memory cells may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductive stack layer. The first dielectric layers 141 and second dielectric layers 142 may be deposited via CVD, PVD, ALD, or a combination thereof.

Figure 2:
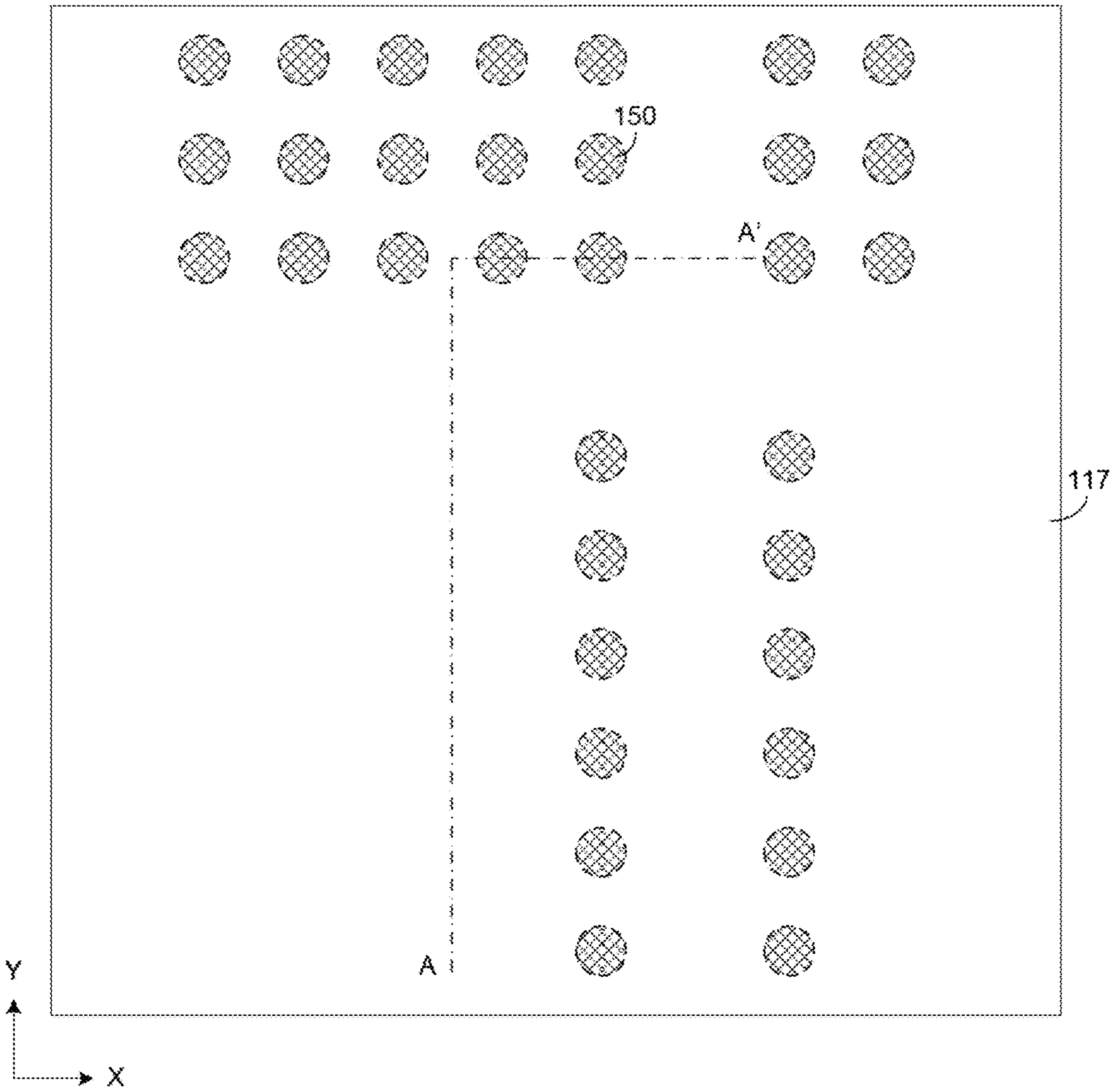
FIGS. 2 and 3 illustrate a top view and a cross-sectional view of the 3D array device shown in FIG. 1 after channel hole structures are formed according to various aspects of the present disclosure.
Figure 3:
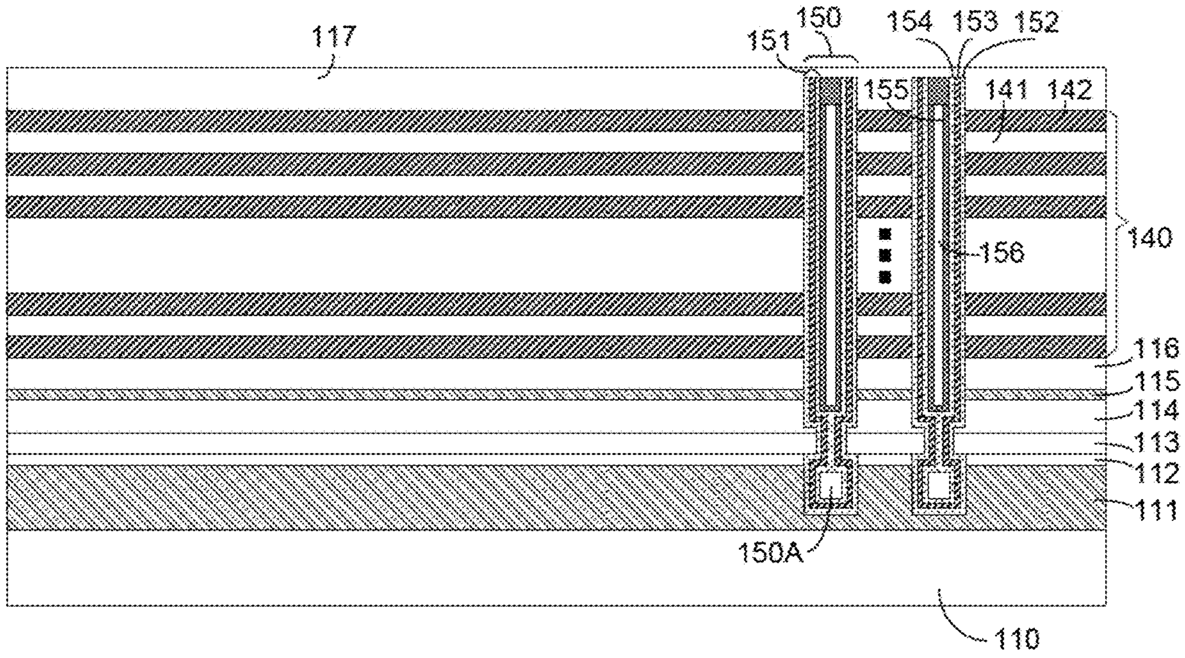

FIGS. 2 and 3 show a schematic top view and a schematic cross-sectional view of the structure of the 3D array device 100 after channel hole structures are formed according to aspects of the present disclosure. The cross-sectional view shown in FIG. 3 is taken along a line AA' of FIG. 2. The channel hole structures are configured in channel hole structure regions 150 and covered by the dielectric layer 117. The contour of the channel hole structure is depicted in dashed line in the top view. The quantity, dimension, and arrangement of the channel hole structures shown in FIGS. 2 and 3 and in other figures in the present disclosure are exemplary and for description purposes, although any suitable quantity, dimension, and arrangement may be used for the disclosed 3D array device 100 according to various aspects of the present disclosure.

As shown in FIGS. 2 and 3, the channel hole structures are arranged to extend in the Z direction or in a direction approximately perpendicular to the substrate 110 and form an array of a predetermined pattern (not shown) in the X-Y plane. The channel holes may be formed by, for example, a dry etch process or a combination of dry and wet etch processes. Other processes may also be performed, such as a patterning process involving lithography, cleaning, and/or chemical mechanical polishing (CMP). The channel holes may have a cylinder shape or pillar shape that extends through the dielectric stack 140, the layers 115-116, and partially penetrates the layer 114. Further, another etch process, such as a dry etch process, may be performed to etch an opening at the bottom of the channel hole. The opening may penetrate through the layers 112-114 and reach or partially penetrate the polysilicon layer 111. Further, a selective etch process such as a selective wet etch process is performed to create a cavity 150A in the polysilicon layer 111 and another cavity (not shown) in the polysilicon layer 115.

Further, a functional layer 151 is deposited on the sidewall of the channel hole and in the cavity 150A. The functional layer 151 includes a blocking layer 152 on the sidewall to block an outflow of charges, a charge trap layer 153 on a surface of the blocking layer 152 to store charges during an operation of the 3D array device 100, and a tunneling layer 154 on a surface of the charge trap layer 153. In some aspects, when the tunneling layer 154 is deposited, the opening of the cavity 150A may pinch off and the cavity 150A may become a void 150A. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, a high-k dielectric material such as aluminum oxide or hafnium oxide, or another wide bandgap material. The tunneling layer 154 may include one or more layers that may include one or more materials. The material for the tunneling layer 154 may include silicon oxide, silicon nitride, silicon oxynitride, a high-k dielectric material such as aluminum oxide or hafnium oxide, or another wide bandgap material.

Further, a semiconductor channel 155 is deposited on a surface of the tunneling layer 154. The semiconductor channel 155 includes a polysilicon layer in some aspects. Optionally, the semiconductor channel 155 may include an amorphous silicon layer. The semiconductor channel 155 may extends through the dielectric stack 140 and into the layer 114 in certain cases. The blocking layer 152, the charge trap layer 153, the tunneling layer 154, and the semiconductor channel 155 may be deposited by, e.g., CVD and/or ALD. The structure formed in a channel hole, including the functional layer 151 and semiconductor channel 155, is referred to as the channel hole structure.

After the semiconductor channel 155 is formed, the opening of the channel hole is filled by an oxide material 156 and a conductive plug is formed at the top of the channel hole structure, as shown in FIG. 3. The conductive plug is connected to the semiconductor channel 155 and may be formed by, e.g., doped polysilicon. Further, a dielectric material (e.g., silicon oxide) is deposited to cover the channel hole structures and thicken the layer 117.

In some cases, the functional layer 151 includes an oxide-nitride-oxide (ONO) structure. That is, the blocking layer 152 is a silicon oxide layer, the charge trap layer 153 is a silicon nitride layer, and the tunneling layer 154 is another silicon oxide layer.

Optionally, the functional layer 151 may have a structure different from the ONO configuration. In the following descriptions, the ONO structure is used exemplarily for the blocking layer 152, the charge trap layer 153, and the tunneling layer 154.

Figure 4:
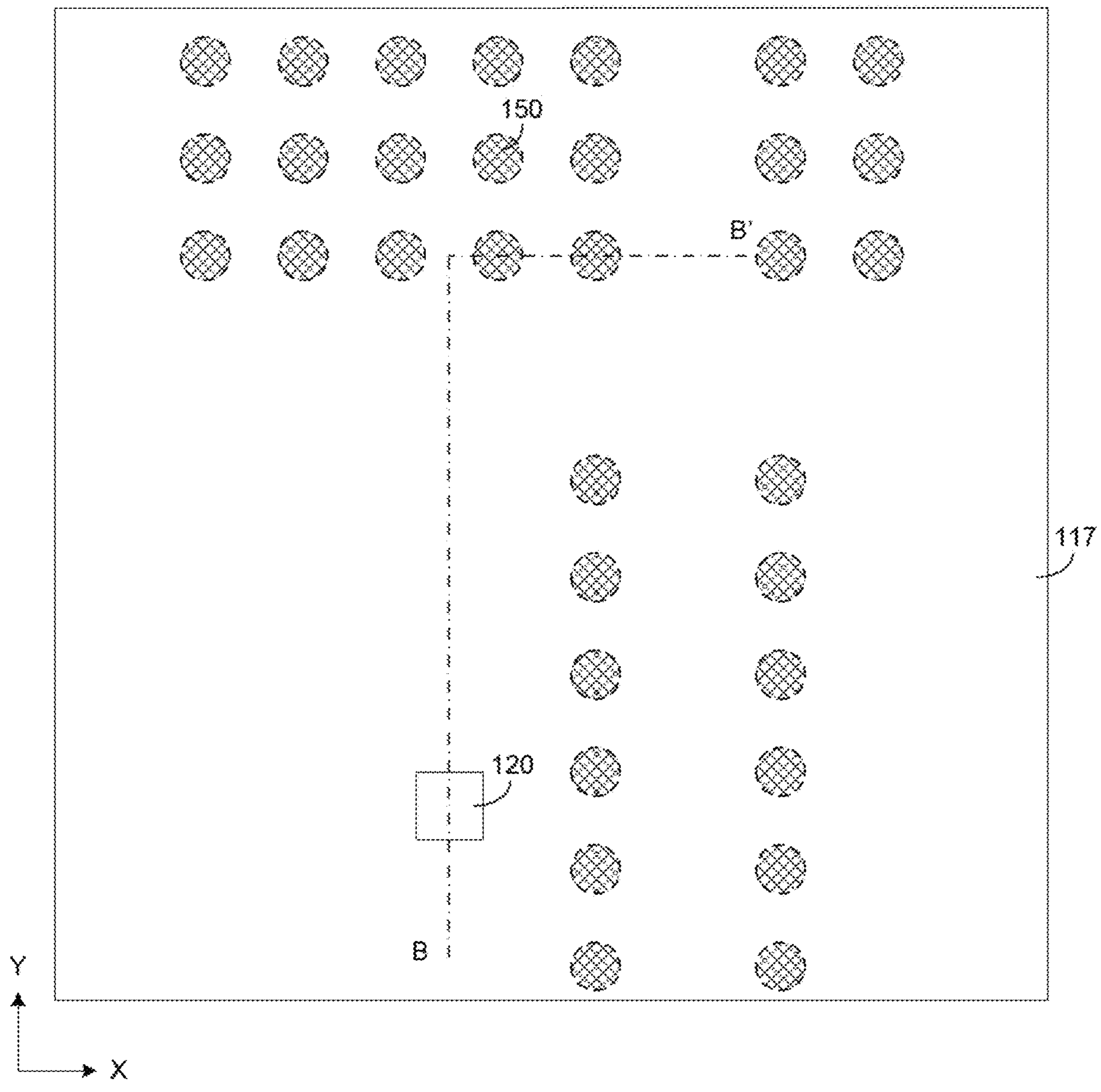
FIGS. 4 and 5 illustrate a top view and a cross-sectional view of the 3D array device shown in FIGS. 2 and 3 after an opening for the SCT is formed according to various aspects of the present disclosure.
Figure 5:
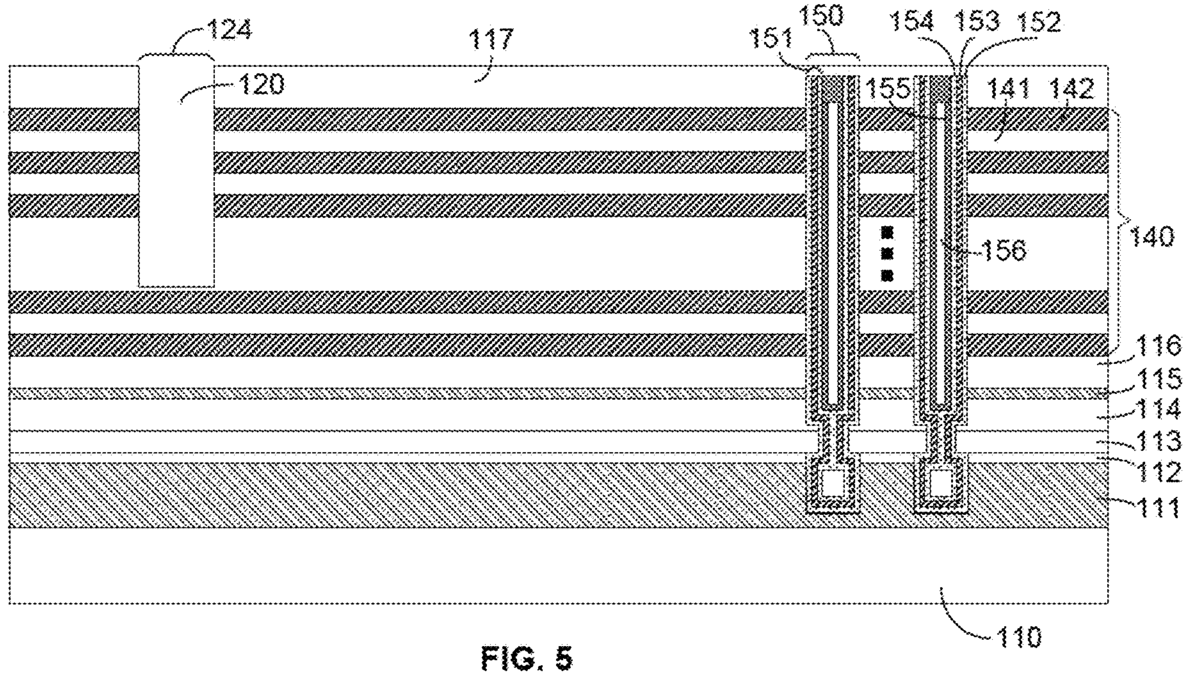

FIGS. 4 and 5 show a schematic top view and a schematic cross-sectional view of the structure of the 3D array device 100 after an opening 120 for a staircase contact (SCT) is formed according to aspects of the present disclosure. The cross-sectional view shown in FIG. 5 is taken along a line BB' of FIG. 4. The opening 120 is in an SCT region 124 as depicted in the figures.

Figure 6:
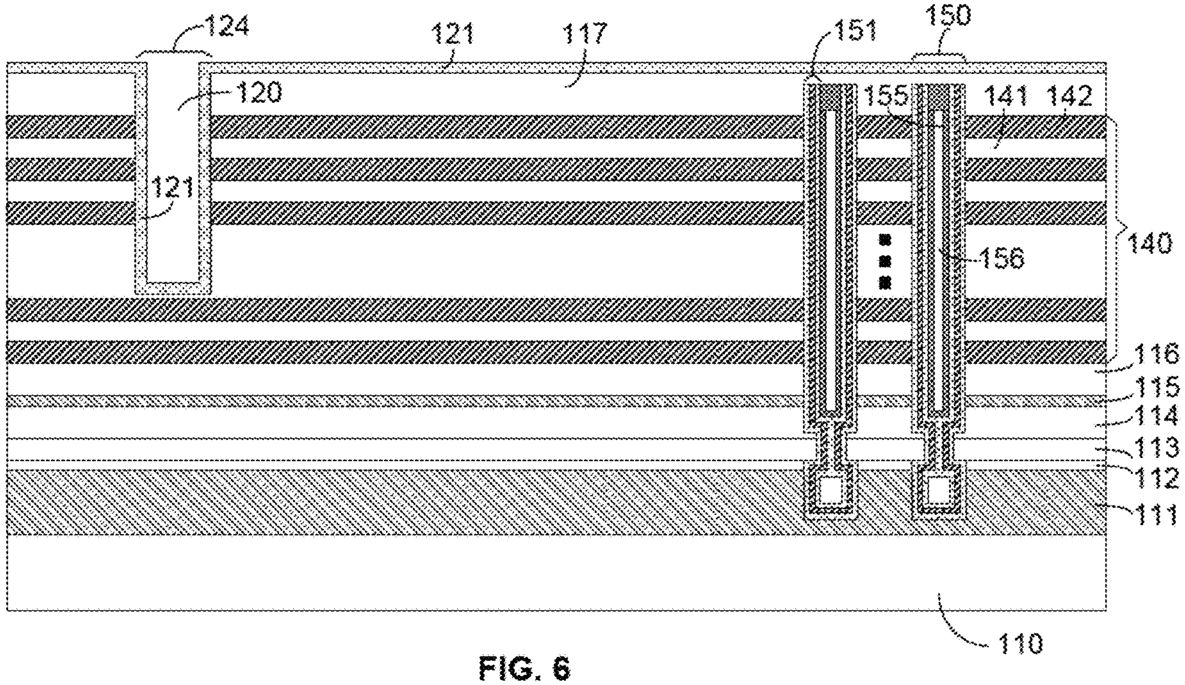
FIGS. 6-10 illustrate cross-sectional views of the 3D array device shown in FIGS. 4 and 5 at certain stages during the fabrication process according to various aspects of the present disclosure.
Figure 7:
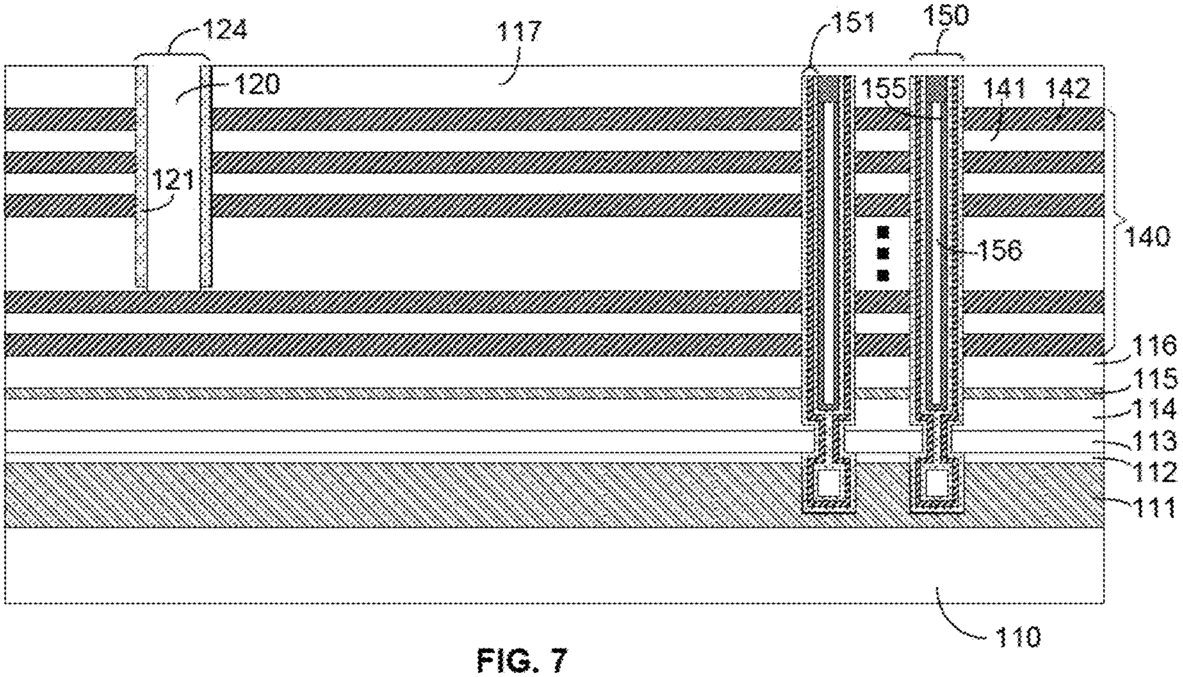

The opening 120 may be formed by, for example, a dry etch process or a combination of dry and wet etch processes. As shown in FIGS. 4 and 5, the opening 120 extends e.g., in the X and Y directions horizontally, and extends through the dielectric stack 140 and reach or partially penetrate a target first dielectric layer 141 in the Z direction or in a direction approximately perpendicular to the substrate 110. As aforementioned, the first and second dielectric layers 141 and 142 are silicon oxide and silicon nitride layers, respectively. At the bottom of the opening 120, the target first dielectric layer 141 is exposed. Further, a dielectric material (e.g., silicon oxide) is deposited to grow a spacer layer 121 by CVD or ALD. Being configured to protect the first and second dielectric layers 141 and 142, the spacer layer 121 covers the sidewall and bottom of the opening 120, as shown in FIG. 6. The top surface is also covered by the layer 121. Further, an etch, such as a dry etch, is conducted to etch away the spacer layer 121 at the bottom of the opening 120 and on the top surface. The etch also removes a part of the target first dielectric layer 141 at the bottom of the opening 120 to expose a target second dielectric layer 142, which is depicted in FIG. 7.

Figure 8:
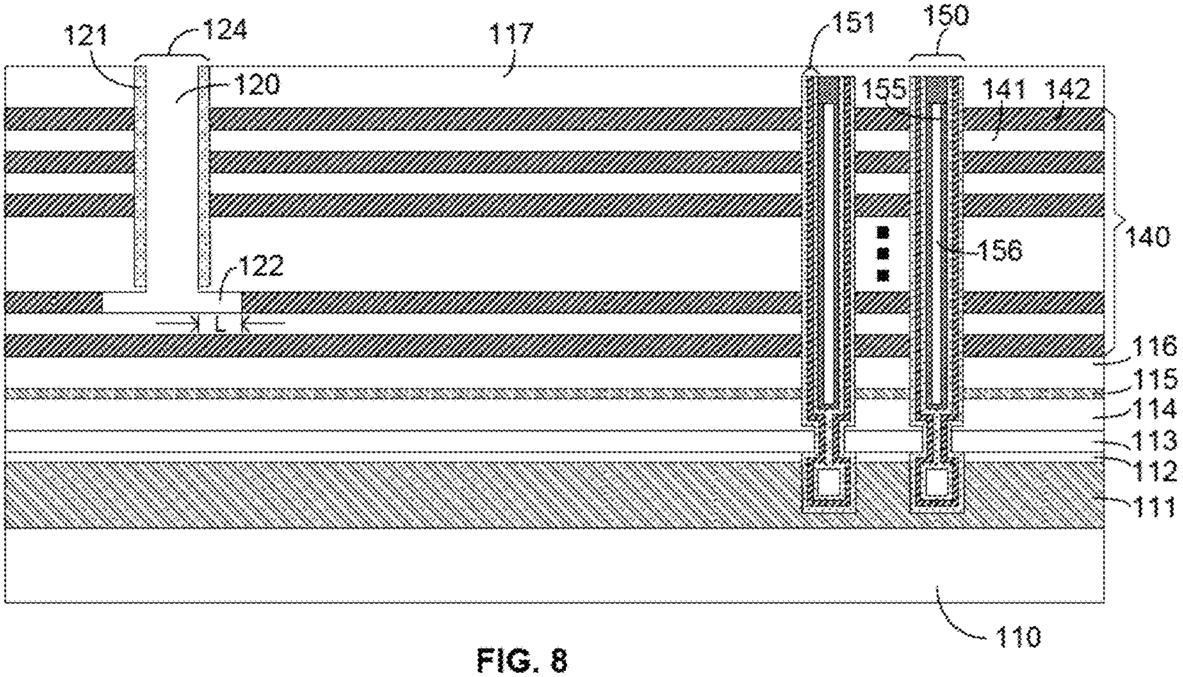

Further, a selective etch, such as a selective wet etch, is performed to etch out a portion of the target second dielectric layer 142 (i.e., a silicon nitride layer). In some embodiments, the selective wet etch is conducted for a predetermined etch time. A cavity 122 is formed after the portion of the layer 142 is removed, as shown in FIG. 8. Optionally, the etch time for creating the cavity 122 may be determined by several factors including the etch rate and a length L of the cavity 122 that extends from the opening 120 to the end of the cavity along the Y direction.

Figure 9:
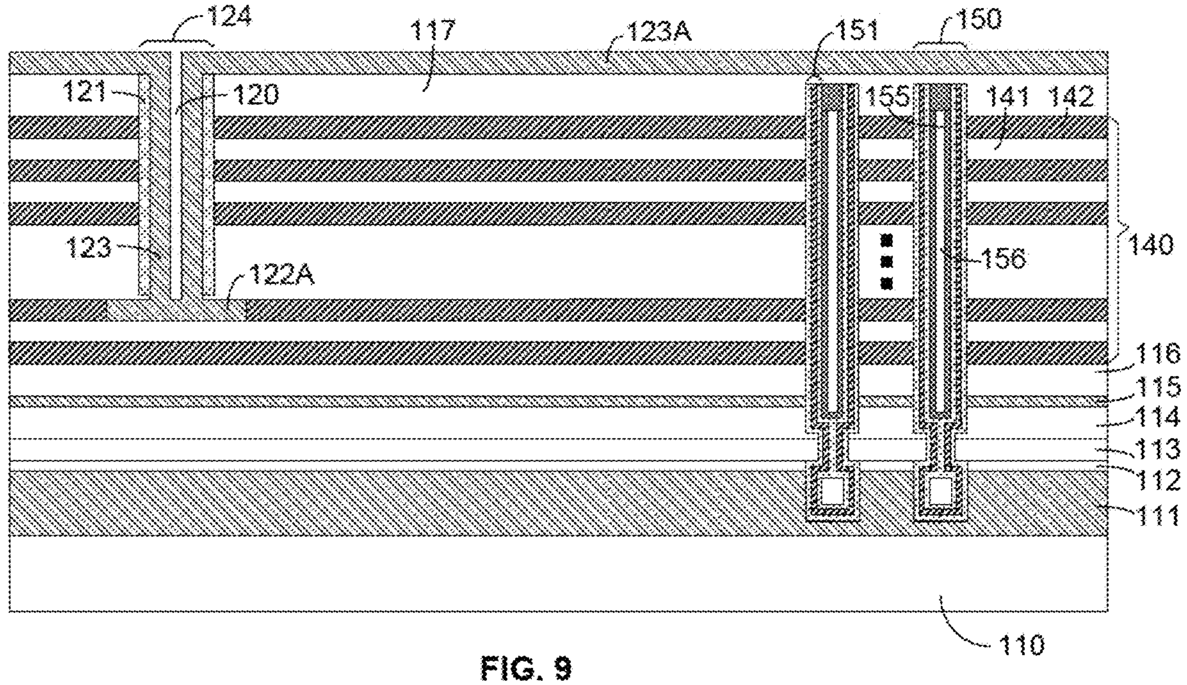
Figure 10:
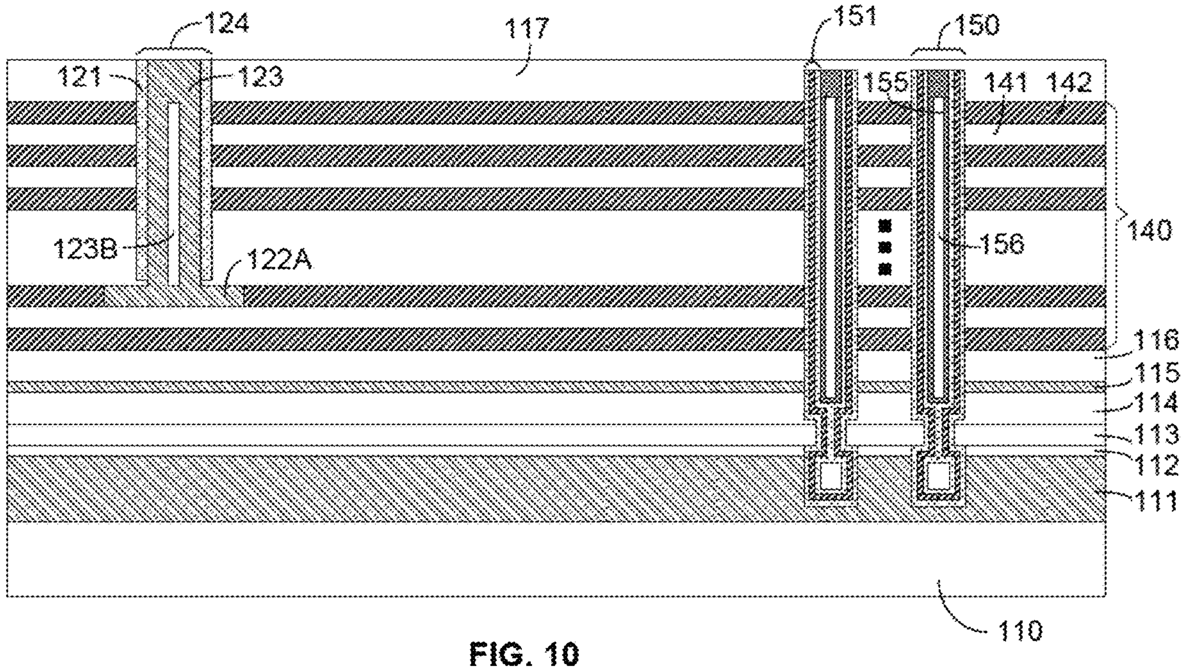

After the cavity 122 is formed, a filling material such as polysilicon is deposited to fill the opening 120 and the cavity 122. The opening 120 is filled with a filling structure 123 and the cavity 122 is filled by a layer 122A, as shown in FIG. 9. The deposition process may be arranged to form the layer 122A with fewer seams or voids in some cases. Optionally, a low pressure chemical vapor deposition (LPCVD) may be performed to fill the cavity 122, while a deposition process other than the LPCVD may be used in some other aspects. The filling structure 123 covers the sidewall of the opening 120 to make the opening smaller, while a layer 123A is formed over the channel hole structures on the top surface. The deposition process may continue or another deposition process (e.g., CVD) may begin to fill the opening 120 fully with the filling structure 123. In some cases, a void 123B may form in the SCT region 124 during the deposition process to fill the opening 120. FIG. 10 shows schematically the structure of the 3D array device 100 with the SCT region 124 after the opening 120 is filled and a CMP process is performed. As shown in FIG. 10, the opening 120 and cavity 122 are filled with the filling structure 123 and the layer 122A, respectively. The layer 122A replaces a portion or section of the target second dielectric layer 142, and contacts other portions or sections of the target second dielectric layer 142 in an X-Y plane.

Figure 11:
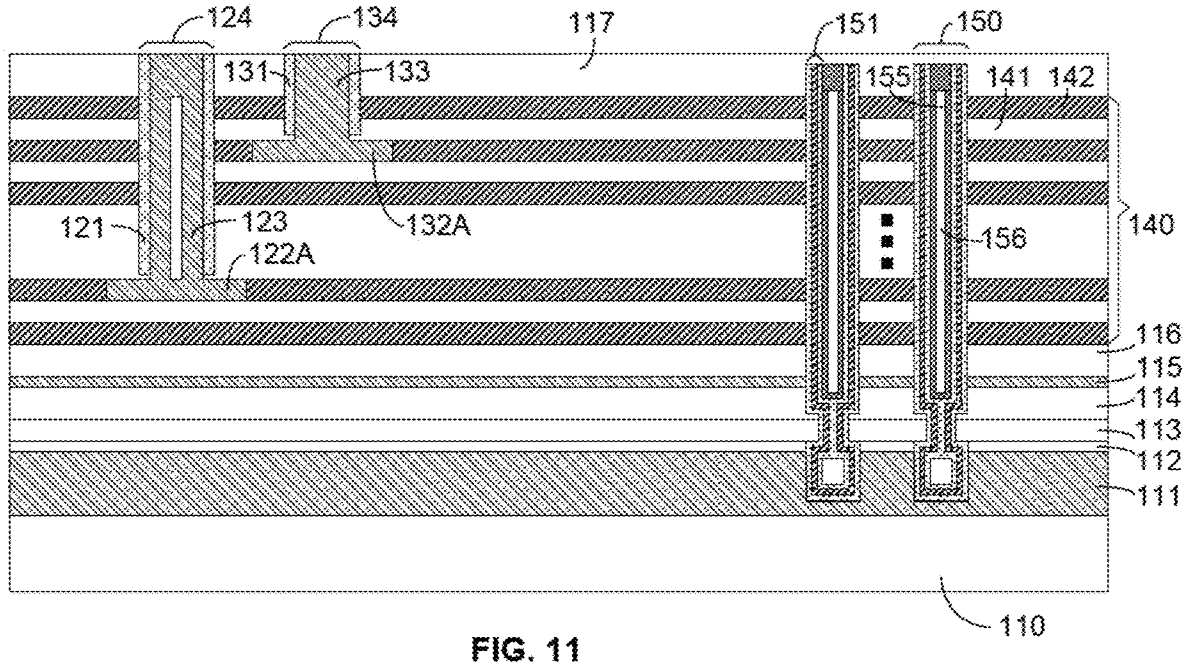
FIG. 11 illustrates a cross-sectional view of the 3D array device shown in FIG. 10 at a certain stage during the fabrication process according to various aspects of the present disclosure

With methods and processes similar to those used to make the structures around the SCT region 124, structures around another SCT region 134 are formed. As shown in FIG. 11, the structures around the SCT region 134 have a dielectric spacer layer 131 (e.g., a silicon oxide layer), a filling structure 133, and a layer 132A. The filling structure 133 and layer 132A are made by depositing a filling material (e.g., polysilicon) in an opening (e.g., similar to the opening 120) and a cavity (e.g., similar to the cavity 122), respectively. The cavity may be made by a selective etch that removes a portion of another target second dielectric layer 142. Optionally, the duration of the selective etch may be determined by certain factors such as the etch rate and a length of the cavity along the Y direction. With similar manners, additional structures (not shown) around other SCT regions may be fabricated for the 3D array device 100.

Figure 12:
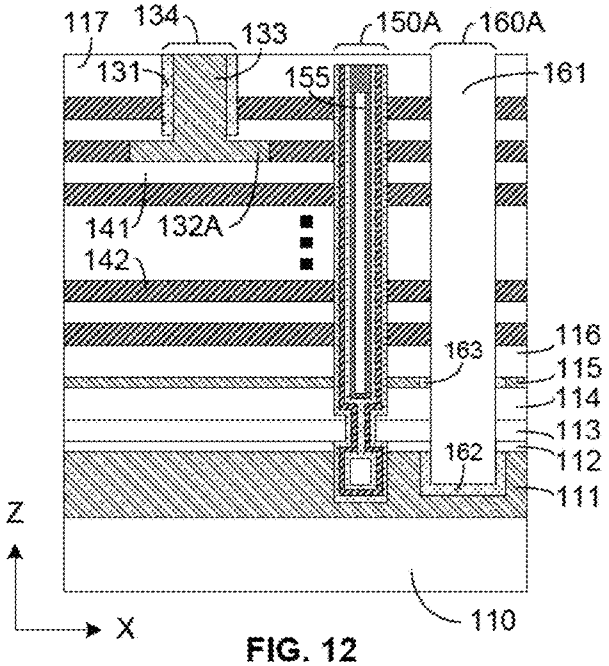
FIGS. 12 and 13 illustrate a cross-sectional view and a top view of the 3D array device shown in FIG. 11 after an opening for gate line slit (GLS) is formed according to various aspects of the present disclosure.
Figure 13:
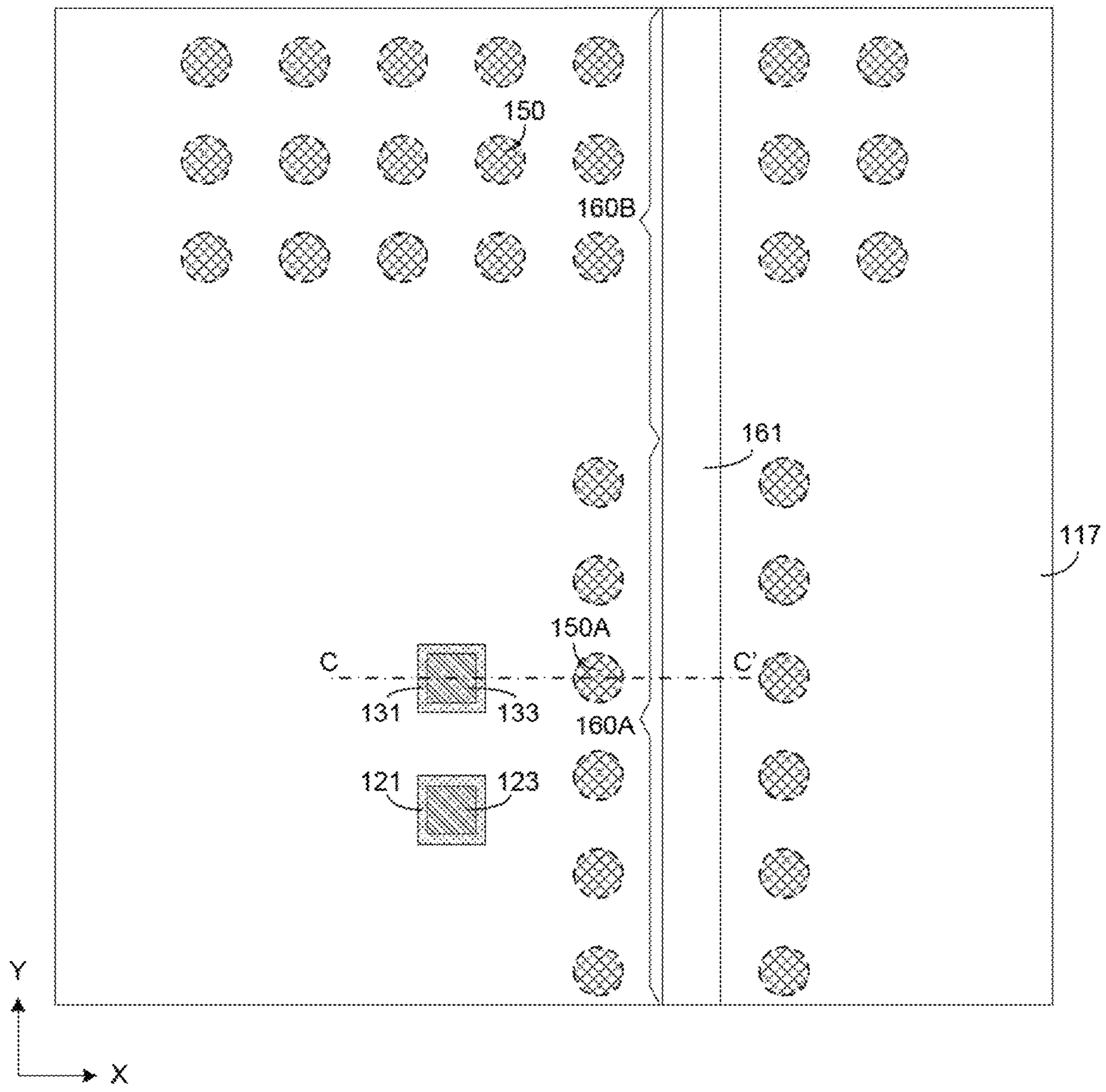

FIGS. 12 and 13 show a schematic cross-sectional view and a schematic top view of the structure of the 3D array device 100 after an opening 161 for GLS is formed according to aspects of the present disclosure. The cross-sectional view shown in FIG. 12 is taken along a line CC' of FIG. 13. A GLS may also be referred to as a gate line slit structure. Optionally, the opening 161 is configured in GLS regions 160A and 160B as depicted in the figures. In some cases, the channel hole structures beside the GLS region 160A are dummy structures in dummy channel hole regions 150A.

The opening 161 may be formed by, for example, a dry etch process or a combination of dry and wet etch processes. As shown in FIGS. 12 and 13, the opening 161 extends, e.g., in the X and Y directions horizontally, and extends through the dielectric stack 140 and reaches or partially penetrates the polysilicon layer 111 in the Z direction or in a direction approximately perpendicular to the substrate 110. As such, at the bottom of the opening 161, the polysilicon layer 111 is exposed.

Figure 14:
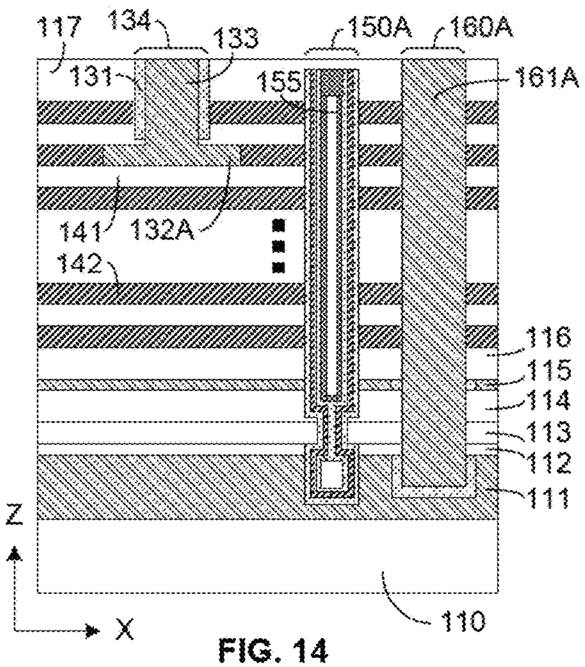
FIGS. 14-18 illustrate cross-sectional views of the 3D array device shown in FIGS. 12 and 13 at certain stages in the fabrication process according to various aspects of the present disclosure.

After the opening 161 is etched, an oxidation process is performed. The exposed portions of the polysilicon layers 111 and 115 are changed into silicon oxide regions 162 and 163, as shown in FIG. 12. In some aspects, the silicon oxide regions 162 and 163 are made to protect the polysilicon layers 111 and 115 during certain etch processes. Further, a filling material (e.g., polysilicon) is deposited to fill the opening 161 in the GLS regions 160A and 160B. A filling structure 161A is formed in the opening 161, as illustrated in FIG. 14.

Figure 15:
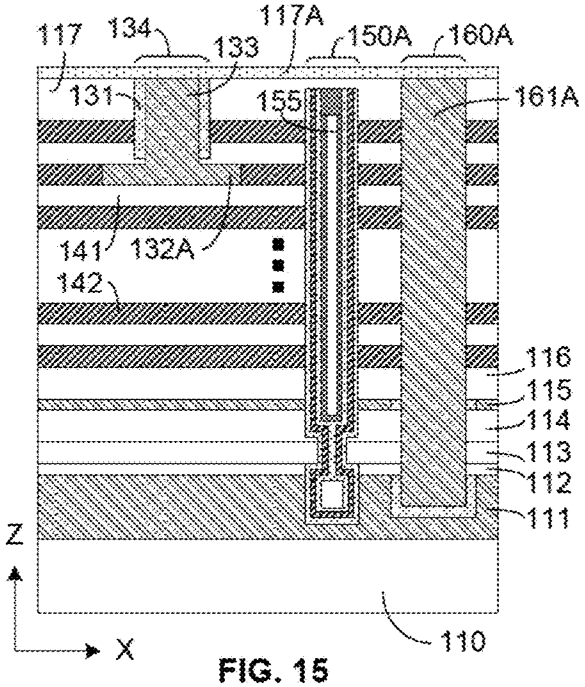
Figure 16:
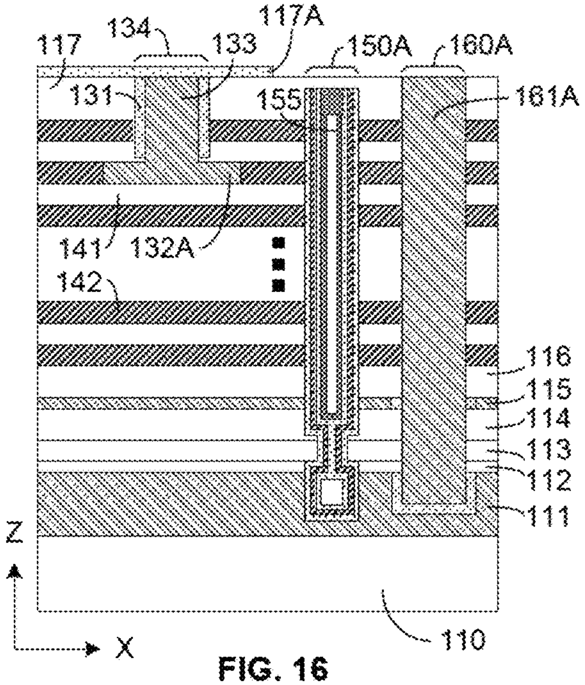

Further, a dielectric material (e.g., silicon oxide) is deposited over the top surface of the 3D array device 100 by CVD and/or ALD. A dielectric layer 117A is grown, as shown in FIG. 15. Thereafter, an etch process is conducted to remove a part of the dielectric layer 117A around the GLS region 160A. A part of the filling structure 161A in the GLS region 160A is exposed, as shown in FIG. 16. The exposed part of the filling structure 161A is etched selectively in an etch, creating an opening 161B in the GLS region 160A.

Figure 17:
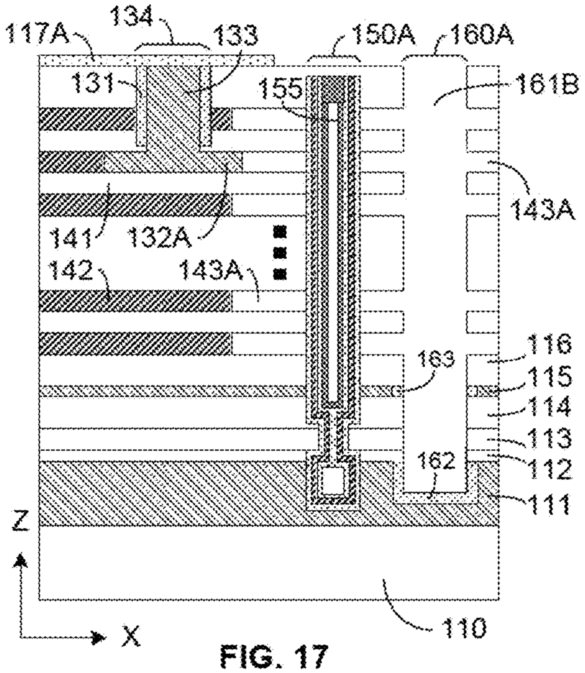

Further, a selective etch is performed for a predetermined time period to remove certain portions of the second dielectric layers 142, leaving cavities 143A between the first dielectric layers 141, as shown in FIG. 17. The predetermined time period is arranged such that the cavities 143A do not reach the SCT regions 124 and 134. That is, the cavities 143A and the spacer layers 121 and 131 are separated by sections of the second dielectric layers 142. Further, a portion of the cavity 143A exposes the layer 132A as shown in FIG. 17, and another portion of the cavity 143A exposes the layer 122A (not shown).

Figure 18:
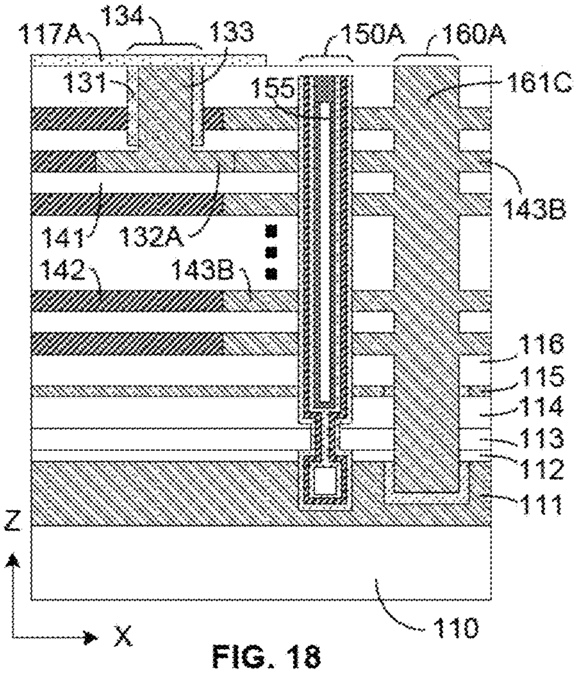

Further, a filling material (e.g., polysilicon) is deposited to fill the opening 161B and cavities 143A. A filling structure 161C is formed to fill the opening 161B, while layers 143B are formed to fill the cavities 143A, as illustrated in FIG. 18.

Figure 19:
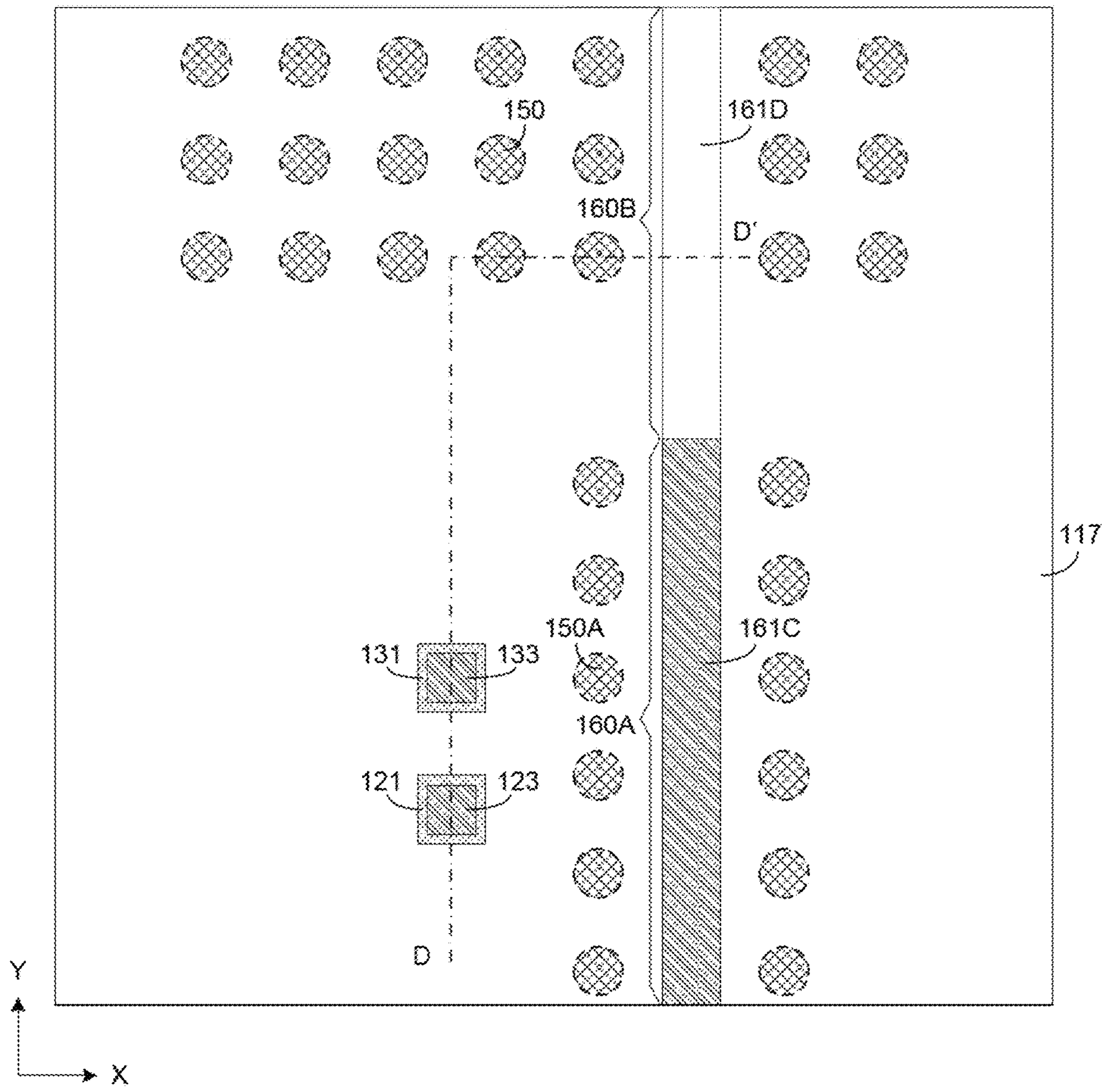
FIGS. 19 and 20 illustrate a top view and a cross-sectional view of the 3D array device shown in FIG. 18 after another opening is formed according to various aspects of the present disclosure.
Figure 20:
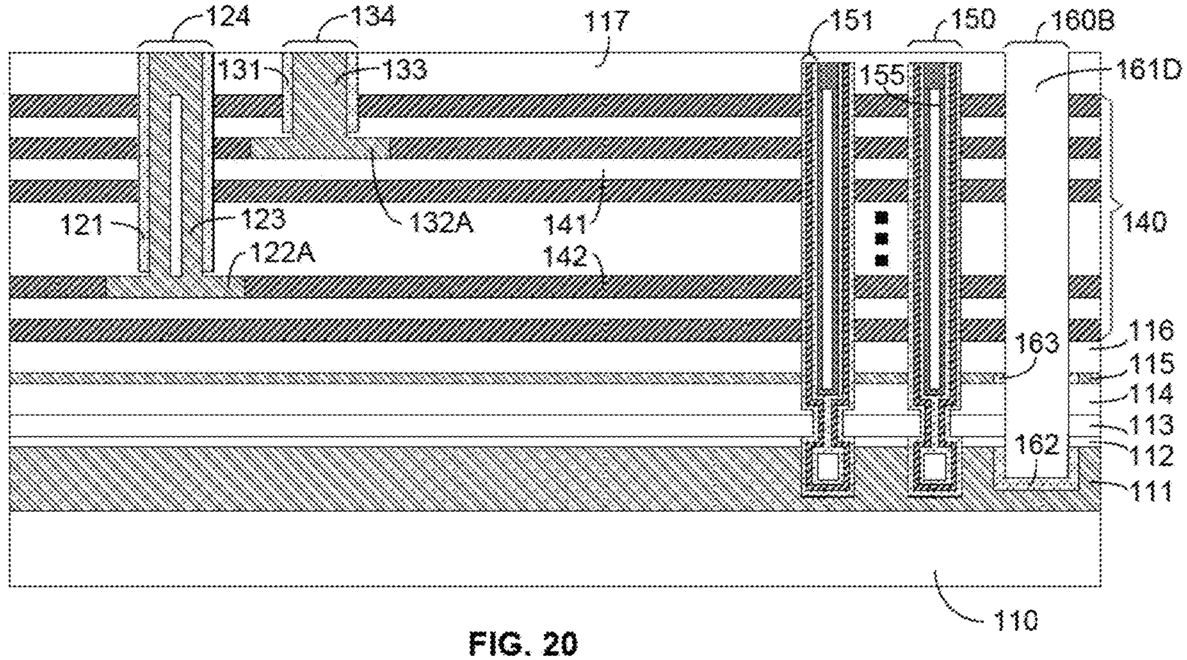

FIGS. 19 and 20 show a schematic top view and a schematic cross-sectional view of the structure of the 3D array device 100 after an opening 161D is formed according to aspects of the present disclosure. The cross-sectional view shown in FIG. 20 is taken along a line DD' of FIG. 19. The opening 161D is in the GLS region 160B and dielectric layer 117A is omitted in the figures for simplicity. The 3D array device 100 has a great number of channel hole structures arranged in memory planes (not shown). Each memory plane is divided into memory blocks (not shown) and memory fingers by the GLS. For example, the configuration of the channel hole structures as shown in FIG. 19 reflects memory fingers separated by the GLS region 160B. As aforementioned, the configuration and quantity of the channel hole structures as depicted in FIG. 19 are exemplary.

The opening 161D represents a section of the opening 161 in the GLS region 160B, and may be formed by, for example, a selective etch process that removes the remaining part of the filling structure 161A. At the bottom of the opening 161D, the polysilicon layer 111 is exposed.

Figure 21:
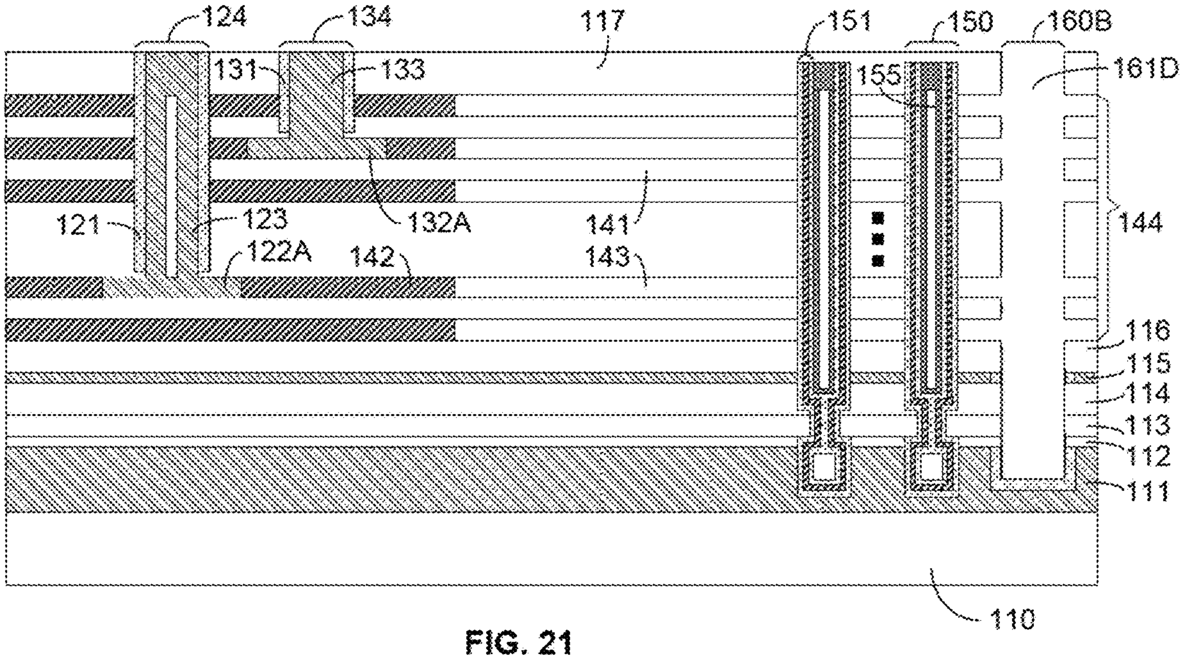
FIGS. 21 and 22 illustrate cross-sectional views of the 3D array device shown in FIGS. 19 and 20 at certain stages in the fabrication process according to various aspects of the present disclosure.

After the opening 161D is formed, a selective etch is performed for a predetermined time period to remove certain portions of the second dielectric layers 142, leaving cavities 143 between the first dielectric layers 141, as shown in FIG. 21. The cavities 143 expose the layers 143B around the GLS region 160A. In some cases, the predetermined time period is arranged such that the cavities 143 do not reach the SCT regions 124 and 134. For example, the cavities 143 and the spacer layers 121 and 131 are separated by sections of the second dielectric layers 142. Optionally, the cavities 143 and the layers 122A and 133A are separated by certain sections of the second dielectric layers 142.

Figure 22:
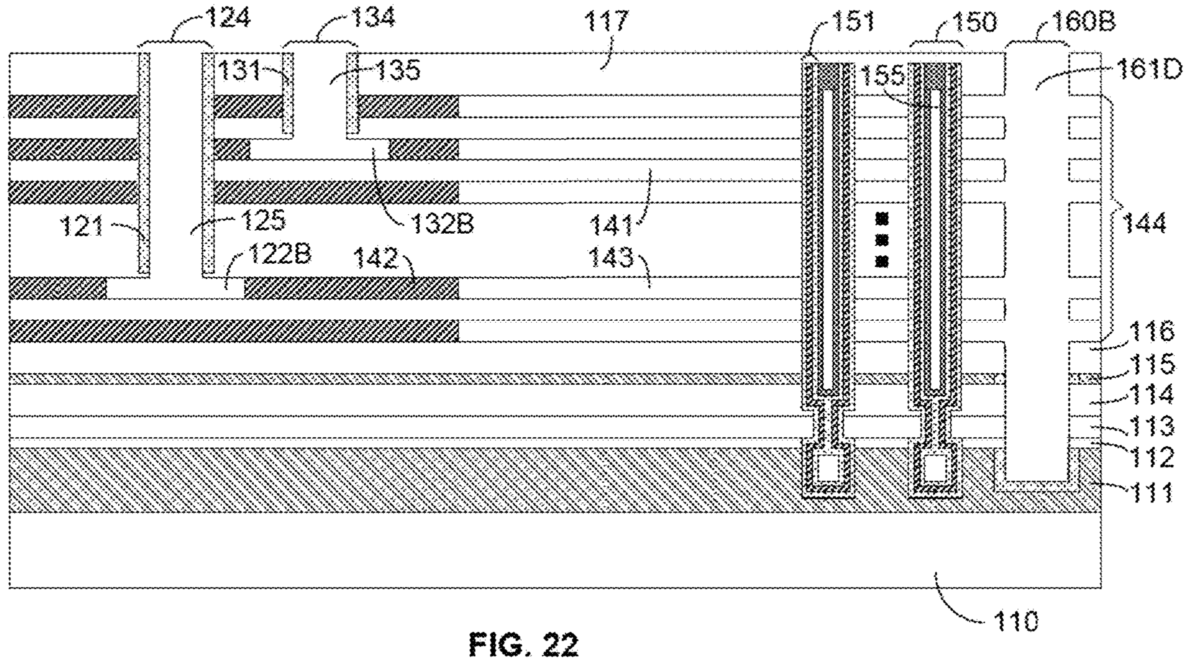

Further, a selective etch, such as a selective wet etch, is performed to etch out the filling structures 123, 133, and 161C During the selective etch, the layers 122A and 132A are also etched away, creating cavities 122B and 132B, as shown in FIG. 22. The cavity 122B may be the same as the cavity 122 in some cases. That is, the cavity 122 reappears. Further, the selective etch also removes the layers 143B such that the cavities 143A reappear between the first dielectric layers 141 around the GLS region 160A, too. Thus, the cavity 122B, a cavity 143A on the same level along the Z direction, and a cavity 143 on the same level become connected. The three cavities merge to form a combined cavity that extends from the bottom of the opening 125 to the channel hole structure regions 150. The combined cavity exposes the blocking layers 152 of the channel hole structures in the channel hole structure regions 150. Similarly, the cavity 132B, a cavity 143A on the same level, and a cavity 143 on the same level become connected and merge together to form another combined cavity with similar features. After the selected etch and formation of the combined cavities, a part of the dielectric stack 140 is changed into a dielectric stack 144, while rest of the dielectric stack 140 represents another dielectric stack structure through which the openings 125 and 135 extend along the Z direction.

Figure 23:
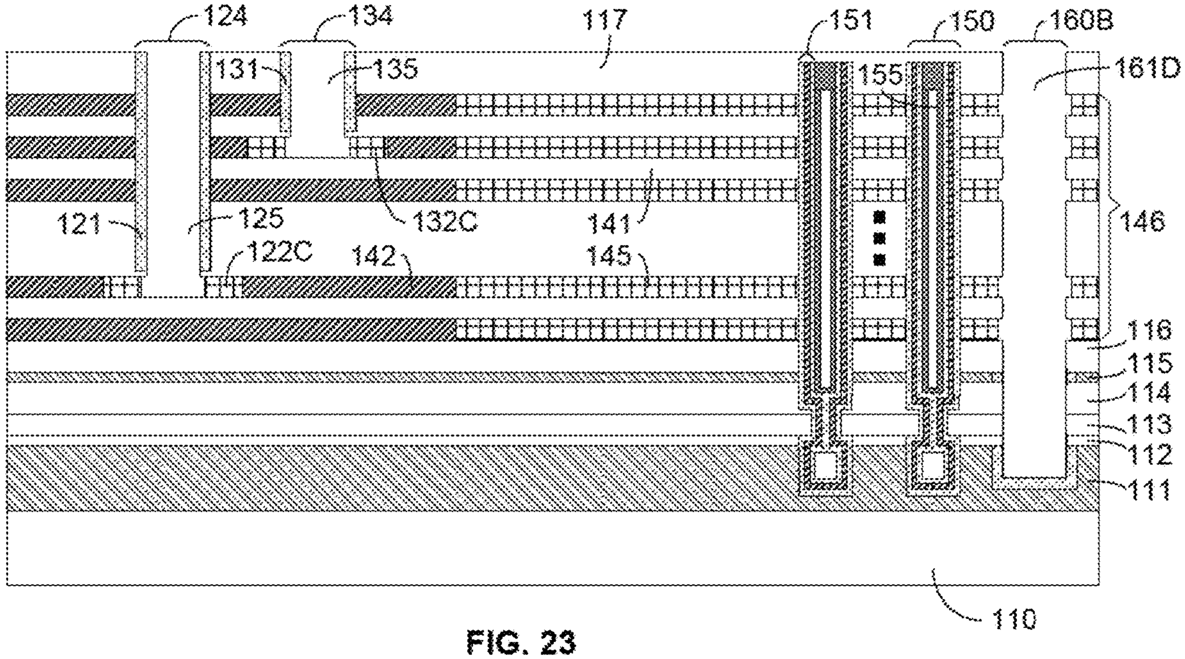
FIGS. 23 and 24 illustrate cross-sectional views of the 3D array device shown in FIG. 22 at certain stages in the fabrication process according to various aspects of the present disclosure.

Further, a conductive material such as tungsten (W) is deposited to fill the cavities 143 left by the removal of the second dielectric layers 142 and the combined cavities. A layer of the conductive material is also formed on the sidewalls and bottoms of the openings 125, 135, and 161D. The layer of the conductive material is subsequently etched away in an etch process, leaving the conductive material in the cavities. As such, conductive layers 145 are formed between the first dielectric layers 141 and contact the blocking layers 152 of the channel hole structures, respectively. Conductive layers 122C and 132C are formed in the cavities 122B and 132B. Conductive layers (not shown) are also formed in the cavities 143A that reappears. After the conductive layers 145 are made, the dielectric stack 144 is converted into a conductor/insulator stack 146, as shown in FIG. 23. The conductor/insulator stack 146 may be considered as a conductor/insulator stack structure that has the first dielectric layers 141 and the conductive layers 145 alternatingly stacked over each other. The stack 146 also contains the channel hole structures, or the functional layers 151 and semiconductor channels 155.

The conductive layer 122C, a conductive layer 145 on the same level, and a conductive layer grown in a cavity 143A of the same level are connected electrically and form a combined conductive layer in one of the combined cavities. Similarly, the conductive layer 132C, a conductive layer 145 on the same level, and a conductive layer grown in a cavity 143A on the same level are connected and form another combined conductive layer. The combined conductive layer extends from the functional layers 151 (or the channel hole structures) in the channel hole structure regions 150 to the bottom of one of the openings for SCT (e.g., the opening 125 or 135). As such, each combined conductive layer is electrically connected with a corresponding conductive layer 145.

In some aspects, before metal W is deposited in the cavities 143, 143A, 122B, and 132B, a layer (not shown) of a high-k dielectric material such as aluminum oxide may be deposited. Thereafter, a layer of a conductive material such as titanium nitride (TiN) (not shown) is deposited. Further, metal W is deposited to form the conductive layers 145, 122C, and 132C. CVD and/or ALD may be used in the deposition processes. Alternatively, another conductive material, such as molybdenum (Mo), ruthenium (Ru), cobalt (Co), copper (Cu), aluminum (Al), titanium (Ti), tantalum (Ta), tantalum nitride (TaN), doped silicon, or any combination thereof, may be used to form these conductive layers.

Referring to FIG. 23, a portion of each functional layer 151 in a channel hole structure region 150 is between a portion of one of the conductive layers 145 and a portion of a semiconductor channel 155 in the channel hole structure. Each conductive layer 145 is configured to connect rows of NAND memory cells in an X-Y plane and is configured as a word line for the 3D array device 100. The semiconductor channel 155 formed in the channel hole structure is configured to connect a column or a string of NAND memory cells along the Z direction and configured as a bit line for the 3D array device 100. As such, a portion of the functional layer 151 in a channel hole structure in an X-Y plane, as a part of a NAND memory cell, is arranged between a conductive layer 145 and a semiconductor channel 155, i.e., between a word line and a bit line. The functional layer 151 may also be considered as disposed between the semiconductor channel 155 and the conductor/insulator stack 146. A portion of the conductive layer 145 that is around a portion of the channel hole structure functions as a control gate or gate electrode for a NAND memory cell. The 3D array device 100 can be considered as including a 2D array of strings of NAND cells (such a string is also referred to as a "NAND string") in the stack 146 or the conductor/insulator stack structure. Each NAND string contains multiple NAND memory cells and extends vertically toward the substrate 110. The NAND strings form a 3D array of the NAND memory cells through the conductor/insulator stack 146 over the substrate 110.

Referring to FIGS. 22-23, the combined cavities are created before the conductor/insulator stack 146 is fabricated. The cavities 143 and combined cavities are filled to form the conductive layers 145 and combined conductive layers in one deposition process. The combined conductive layers extend from the openings in the SCT regions to the channel hole structure regions 150, respectively. Formation of the conductive layers 145 and combined conductive layers in one deposition process has certain reliability and cost advantages, compared to using two deposition processes and extra etch processes in some other cases.

Figure 24:
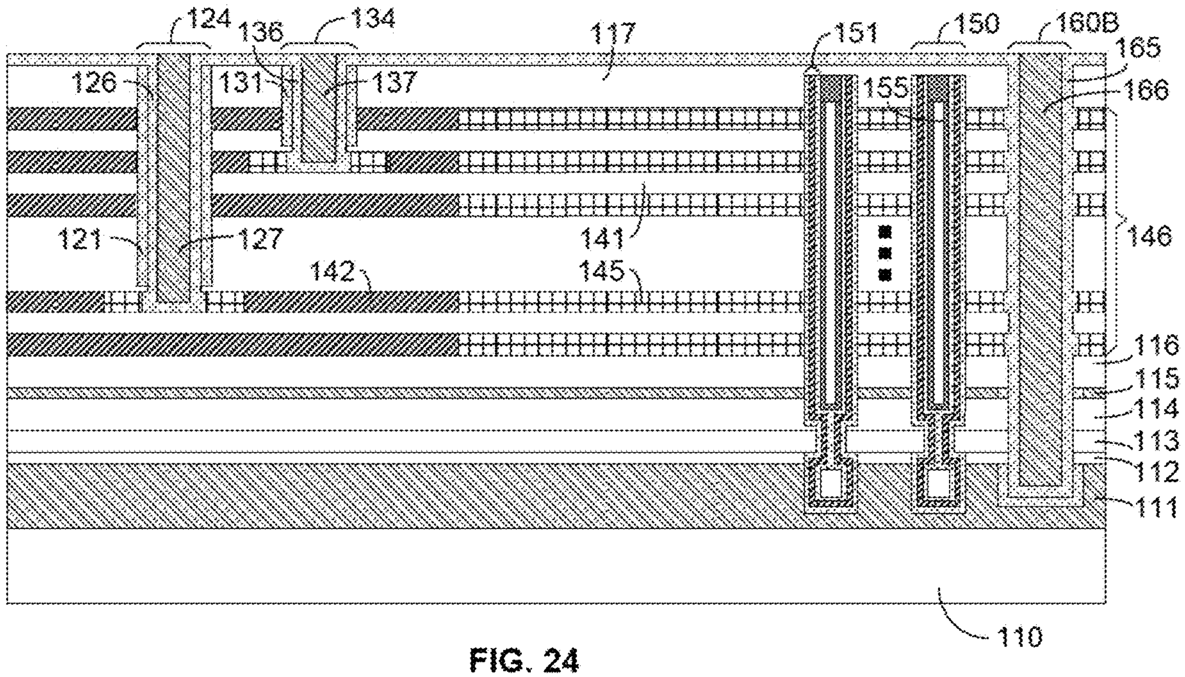

Referring to FIG. 24, after the conductive layers are formed in the cavities, a dielectric material (e.g., silicon oxide) is deposited on the sidewalls and bottom surfaces of the openings 125, 135, and 161D by CVD and/or ALD. Dielectric layers 126, 136, and 165 are grown, respectively. Further, a material (e.g., undoped polysilicon) is deposited to fill the openings 125, 135, and 161 by CVD and/or ALD, followed by an optional CMP process. The filling process forms filling structures 127, 137, and 166, respectively, as shown in FIG. 24. In some cases, the dielectric layer 165 and filling structure 166 in the GLS region 160B may be referred to as the GLS structure. In some aspects, certain voids (not shown) may form in the filling structures.

Figure 25:
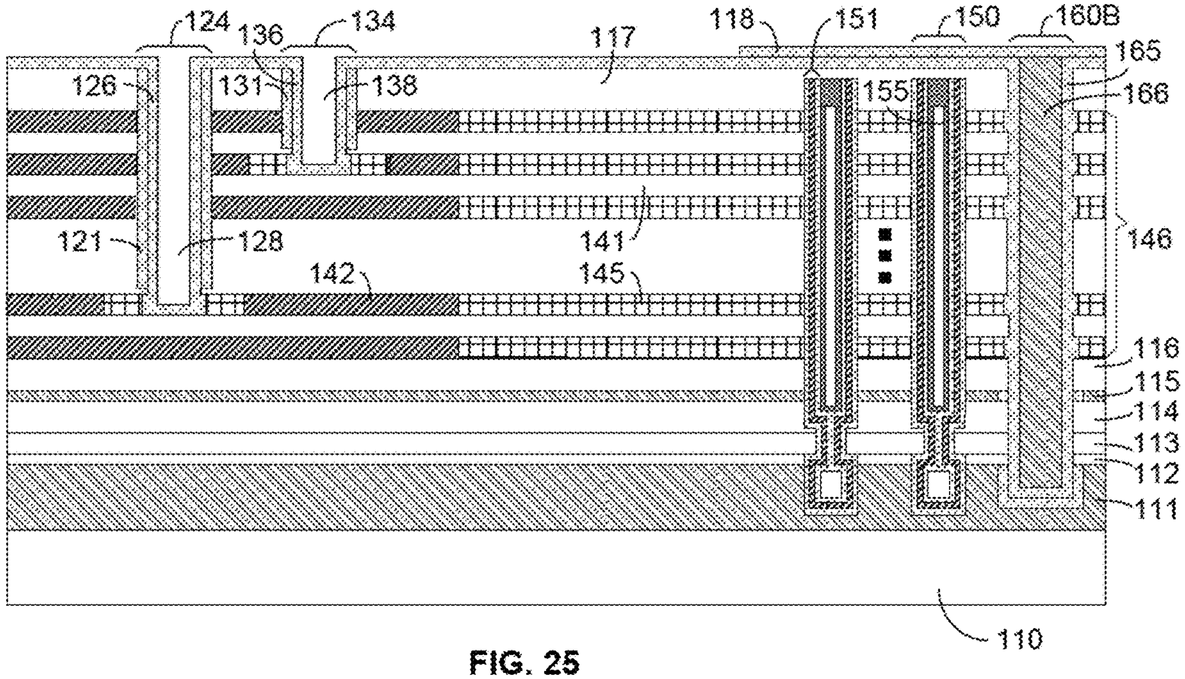
FIGS. 25-27 illustrate cross-sectional views of the 3D array device shown in FIG. 24 at certain stages in the fabrication process according to various aspects of the present disclosure.

Further, a silicon oxide layer 118 is deposited over the top surface including the SCT regions 124 and 134, the channel hole structure regions 150, and the GLS region 160B. CVD, PVD, and/or ALD may be performed. A portion of the silicon oxide layer 118 that covers the SCT regions 124 and 134 is removed in an etch process (e.g., dry and/or wet etch), exposing the filling structures 127 and 137. After a selective etch process (e.g., a selective wet etch process), the filling structures 127 and 137 are removed and openings 128 and 138 are formed in the SCT regions, as depicted in FIG. 25.

Figure 26:
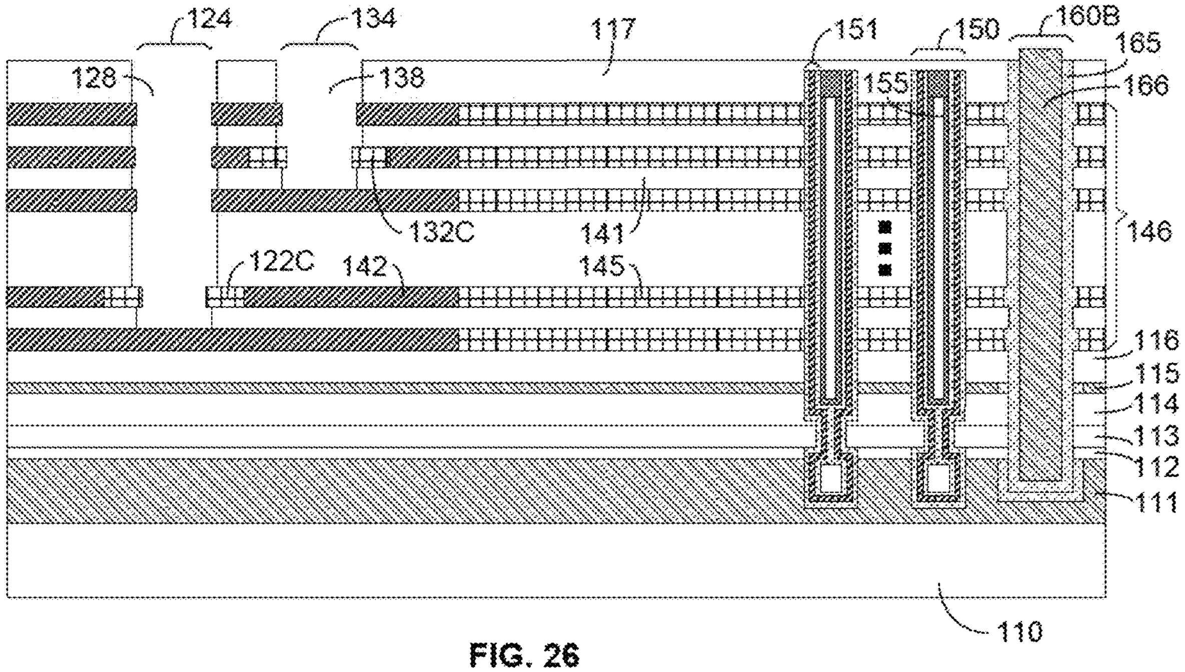

The SCT regions 124 and 134, channel hole structure regions 150, and GLS region 160B are covered by layers of silicon oxide. These silicon oxide layers are etched away in a selective etch process such as a selective wet etch process. As shown in FIG. 26, the openings 128 and 138 become larger after the sidewalls are etched away. Inside the openings to 128 and 138, the conductive layers 122C and 132C are exposed in sidewall regions close to the bottom. Certain portions of the first and second dielectric layer 141 and 142 are exposed on the sidewall, and a portion of the second dielectric layer 142 underneath the layer 122C (or 132C) is exposed at the bottom of the opening 128 (or 138).

Further, a conductive material is deposited by CVD and/or ALD. The conductive material may include a metallic material such as W, Co, Cu, or Al in some aspects. The deposition creates SCT layers 129A and 139A in the openings 128 and 138. The SCT layers 129A and 139A may be considered as SCTs 129 and 139 that are electrically connected to corresponding conductive layers 145 (i.e., word lines) via the conductive layers 122C and 132C, respectively. Take the SCT 129 for example. As the second dielectric layer 142 underneath the layer 122C is exposed in the openings 128, the SCT 129 is deposited on and contact the second dielectric layer 142 underneath the layer 122C, forming an interface between the SCT 129 and the second dielectric layer 142. The interface is parallel to the substrate 110 and layer 122C. The SCT 129 extends through the dielectric stack structure formed by the first and second dielectric layers 141 and 142, and passes through the layer 122C and the first dielectric layer 141 underneath the layer 122C in the Z direction or a direction perpendicular to the substrate 110 and layer 122C. In such cases, a section of the SCT layer 129A is formed at the bottom of the opening 128. This section of the SCT layer 129A contacts the second dielectric layer 142 underneath the layer 122C, and is at a level below that of the layer 122C or a corresponding conductive layer 145 it is connected with.

Figure 27:
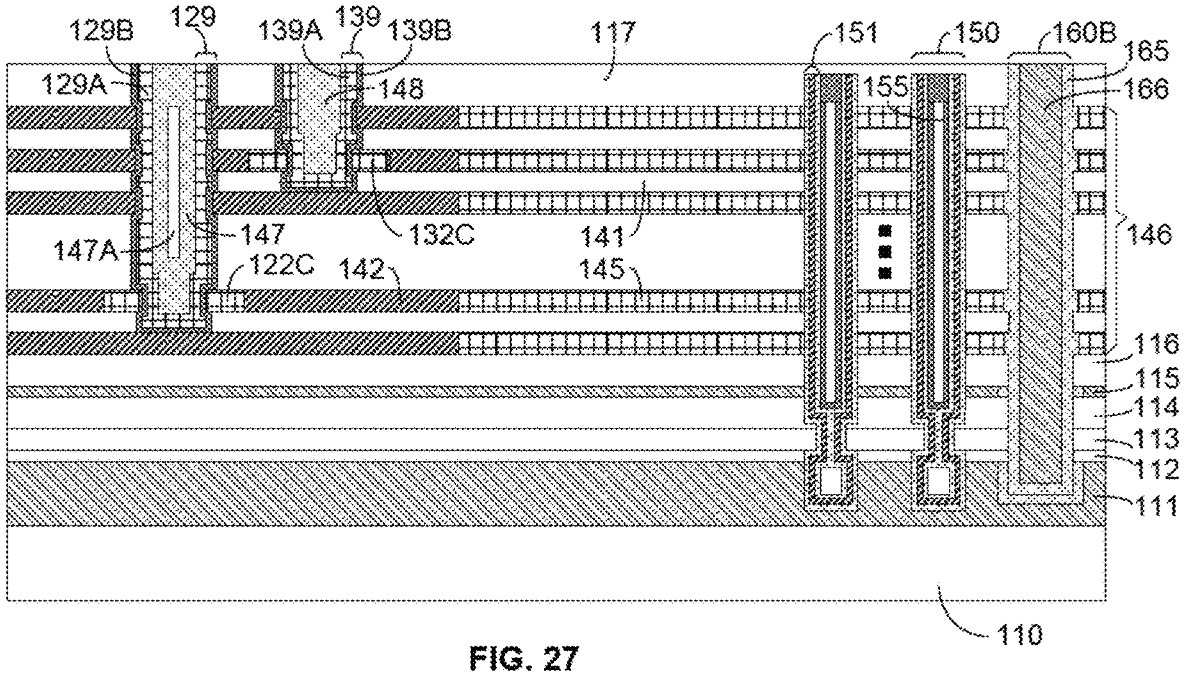

In some cases, before forming the SCT layers 129A and 139A, a conductive material such as TiN may be deposited first to grow thin layers 129B and 139B as a contact and/or barrier layer on the sidewalls and bottom surfaces of the openings 128 and 138. In such cases, the SCT layers 129A and 139A may be deposited on the layers 129B and 139B, respectively, as shown in FIG. 27. In these cases, the SCT 129 contains the SCT layer 129A and layer 129B, and the SCT 139 contains the SCT layer 139A and layer 139B. The layer 129B is between the SCT layer 129A and the layer 122C, while the layer 139B is between the SCT layer 139A and the layer 132C, e.g., in an X-Y plane.

After the SCTs 129 and 139 are formed, a dielectric material such as silicon oxide is deposited by CVD to fill the openings 128 and 138, producing dielectric filling structures 147 and 148 in the openings 128 and 138, respectively. The filling structures 147 and 148 are horizontally surrounded by the SCTs 129 and 139, respectively. Voids (e.g., a void 147A) may form in the filling structures 147 and 148 in certain cases.

In some aspects, the SCTs 129 and 139 have a 3D pocket structure (or surrounding structure) in the SCT regions 124 and 134. The pocket structure may have any shape (e.g., a square or circular shape) in an X-Y plane and extend toward the substrate along the Z direction. The bottom of the pocket structure contacts the second dielectric layer 142, and the side of the pocket structure electrically contacts the layer 122C or 132C. The dielectric filling structures 147 and 148 are formed in and surrounded by the pocket structures.

As illustrated above, an SCT (e.g., the SCT 129 or 139) is electrically connected with a conductive layer 145 (i.e., a word line), while other conductive layers 145 are isolated from the SCT by portions of the first and second dielectric layers 141 and 142 that are around the SCT. Optionally, a CMP process is performed after the openings are filled. Besides openings 125 and 135 and cavities 122B and 132B, when additional openings and cavities are formed in other SCT regions, additional SCTs may be fabricated simultaneously in the process illustrated above. These additional SCTs may connect with corresponding conductive layers 145, respectively.

Figure 28:
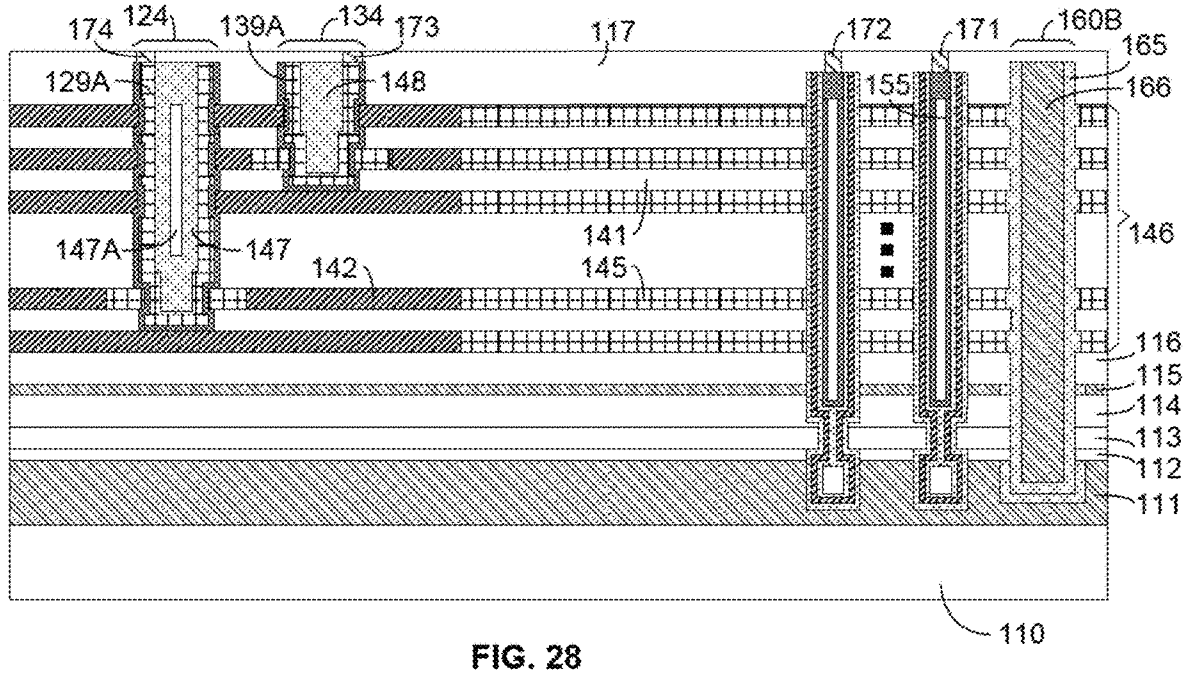
FIGS. 28 and 29 illustrate cross-sectional views of the 3D array device shown in FIG. 27 at certain stages in the fabrication process according to various aspects of the present disclosure.

Referring to FIG. 27, a CVD or PVD process is performed to deposit a dielectric material (e.g., silicon oxide) to cover the SCT regions 124 and 134, the channel hole structure regions 150, and the GLS region 160B, thickening the dielectric layer 117. Openings (not shown) for vias 171-174 are formed by a dry etch process or a combination of dry and wet etch processes. The openings are subsequently filled by a conductive material (e.g., W, Co, Cu, Mo, Ru, or Al) to form the vias 171-174, as illustrated in FIG. 28. The vias 171-174 electrically contact the conductive plugs of the channel hole structures and the SCTs 139 and 129, respectively. Optionally, a layer of a conductive material (e.g., TiN) may be deposited as a contact layer before another conductive material is deposited when the vias 171-174 are fabricated.

Further, conductor layers 175 for interconnect are grown by CVD, PVD, and/or ALD. The conductor layers 175 are deposited over and connected to the vias 171-174, respectively, and include a conductive material such as W, Co, Cu, Al, Mo, Ru, or a combination thereof. Optionally, a contact layer (e.g., TiN) may be deposited before the conductive material is deposited to create the conductor layers 175.

Further, vias 176 are formed over the conductor layers 175. For example, a dielectric material may be deposited to cover the conductor layers 175 and make the dielectric layer 117 thicker. After openings for vias 176 are formed, a thin layer of TiN may be deposited in some cases. The openings are then filled with a conductive material to form the vias 176. The conductive material of the vias 176 may include W, Co, Cu, Al, Mo, or Ru.

Figure 29:
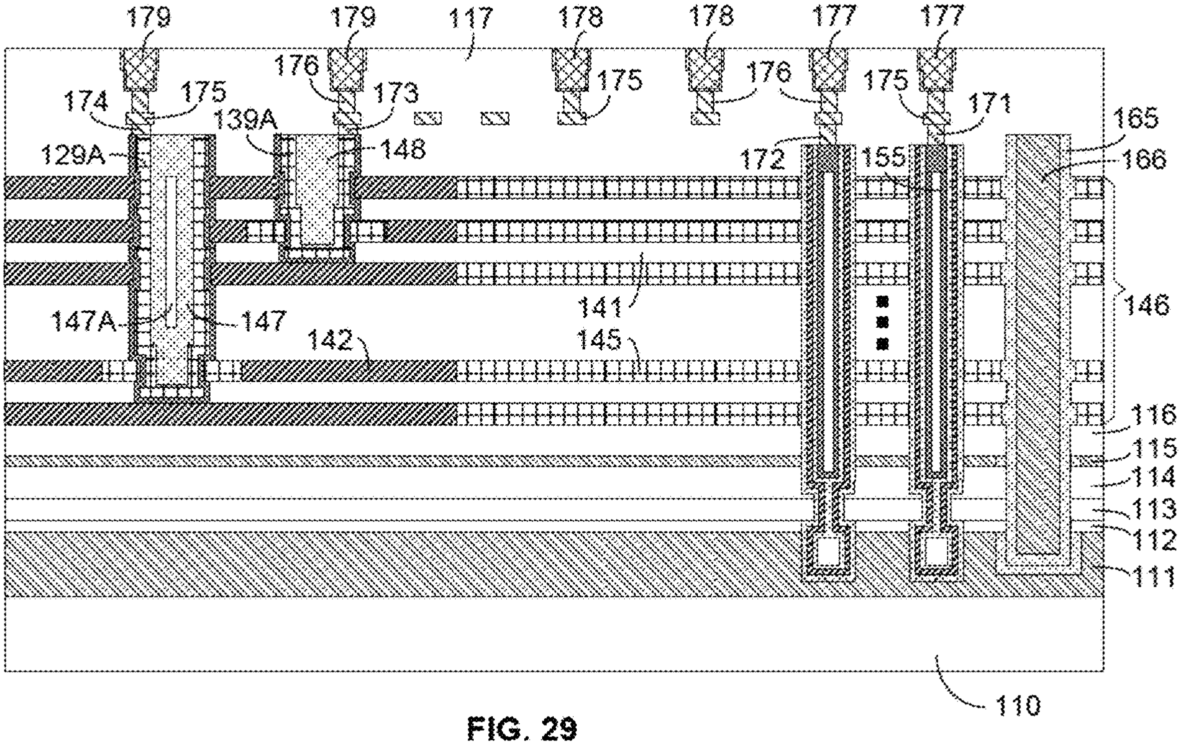

Further, a CVD or PVD process is performed to deposit a dielectric material (e.g., silicon oxide) to cover the vias 176 and thicken the dielectric layer 117 further. Openings are made and then filled to form connecting pads 177, 178, and 179 that serve as interconnects with a periphery device. As shown in FIG. 29, the connecting pads 177-179 are deposited over and contact the vias 176, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

Figure 30:
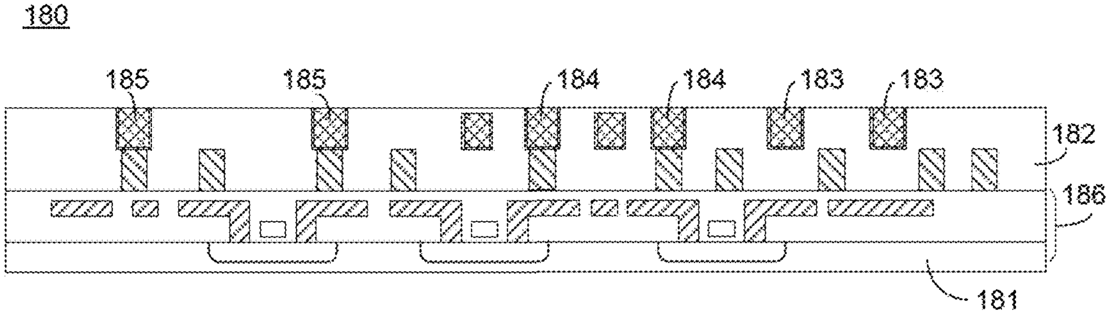
FIG. 30 illustrates a cross-sectional view of an exemplary periphery device according to various aspects of the present disclosure.

FIG. 30 shows a schematic cross-sectional view of a periphery device 180 according to aspects of the present disclosure. The periphery device 180 is a part of a 3D memory device and may also be referred to as a peripheral structure. The periphery device 180 includes a substrate 181 that may include single crystalline silicon, Ge, SiGe, SiC, SOI, GOI, polysilicon, or a Group III-V compound such as GaAs or InP. Periphery CMOS circuits 186 (e.g., control circuits) are fabricated on the substrate 181 and used for facilitating the operation of the 3D memory device. For example, the periphery CMOS circuits 186 may include metal-oxide-semiconductor field-effect transistors (MOSFETs) and provide functional devices such as page buffers, sense amplifiers, column decoders, and row decoders. A dielectric layer 182 is deposited over the substrate 181 and the CMOS circuits 186. Connecting pads (such as connecting pads 183-185) and vias for interconnect are formed in the dielectric layer 182. The dielectric layer 182 includes one or more dielectric materials such as silicon oxide and silicon nitride. The connecting pads 183-185 are formed to connect with the 3D array device 100 and may include a conductive material such as W, Co, Cu, Al, Ti or a combination thereof.

For the 3D array device 100 and periphery device 180, the bottom side of the substrate 110 or 181 may be referred to as the back side, and the side with the connecting pads 177-179 or 183-185 may be referred to as the front side or face side.

Figure 31:
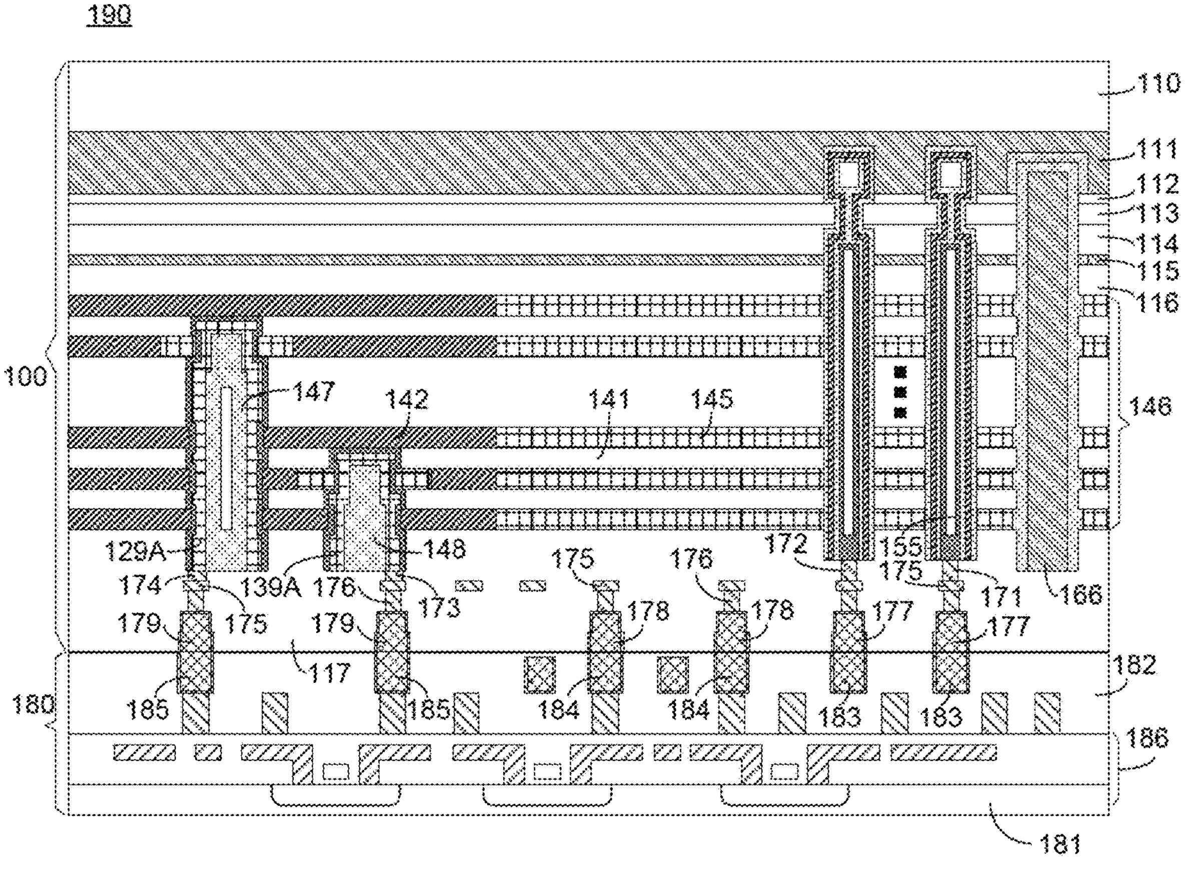
FIG. 31 illustrates a cross-sectional view of a 3D memory device after the 3D array device shown in FIG. 29 is bonded with the periphery device shown in FIG. 30 according to various aspects of the present disclosure.

FIG. 31 schematically shows a fabrication process of an exemplary 3D memory device 190 in a cross-sectional view according to aspects of the present disclosure. The 3D memory device 190 includes the 3D array device 100 shown in FIG. 29 and the periphery device 180 shown in FIG. 30.

The 3D array device 100 and periphery device 180 are bonded by a flip-chip bonding method to form the 3D memory device 190, as shown in FIG. 31. In some aspects, the 3D array device 100 is flipped vertically and becomes upside down with the top surfaces of the connecting pads 177-179 facing downward. The two devices are placed together such that the 3D array device 100 is above the periphery device 180. After an alignment is made, e.g., the connecting pads 177-179 are aligned with the connecting pads 183-185, respectively, the 3D array device 100 and periphery device 180 are joined face to face and bonded together. The conductor/insulator stack 146 and the periphery CMOS circuits become sandwiched between the substrates 110 and 181 or between the layer 111 and the substrate 181. In some aspects, a solder or a conductive adhesive is used to bond the connecting pads 177-179 with the connecting pads 183-185, respectively. As such, the connecting pads 177-179 are connected to the connecting pads 183-185, respectively. The 3D array device 100 and periphery device 180 are in electrical communication after the flip-chip bonding process is completed.

Thereafter, other fabrication steps or processes are performed to complete fabrication of the 3D memory device 190. The other fabrication steps and processes are not reflected in FIG. 31 for simplicity. For example, from the bottom surface (after the flip-chip bonding), the substrate 110, layers 111-113, and a portion of the layer 114 may be removed by a thinning process, such as wafer grinding, dry etch, wet etch, CMP, or a combination thereof. After the thinning process, the semiconductor channels 155 may be exposed in the channel hole structure regions. Optionally, a conductive material (e.g., Cu, W, Co, or Al) may be deposited to electrically connect the exposed semiconductor channels 155 to an array common source. Further, a passivation layer is deposited, contact pads are formed, and additional fabrication steps or processes are performed. Details of the additional fabrication steps or processes are omitted for simplicity.

Figure 32:
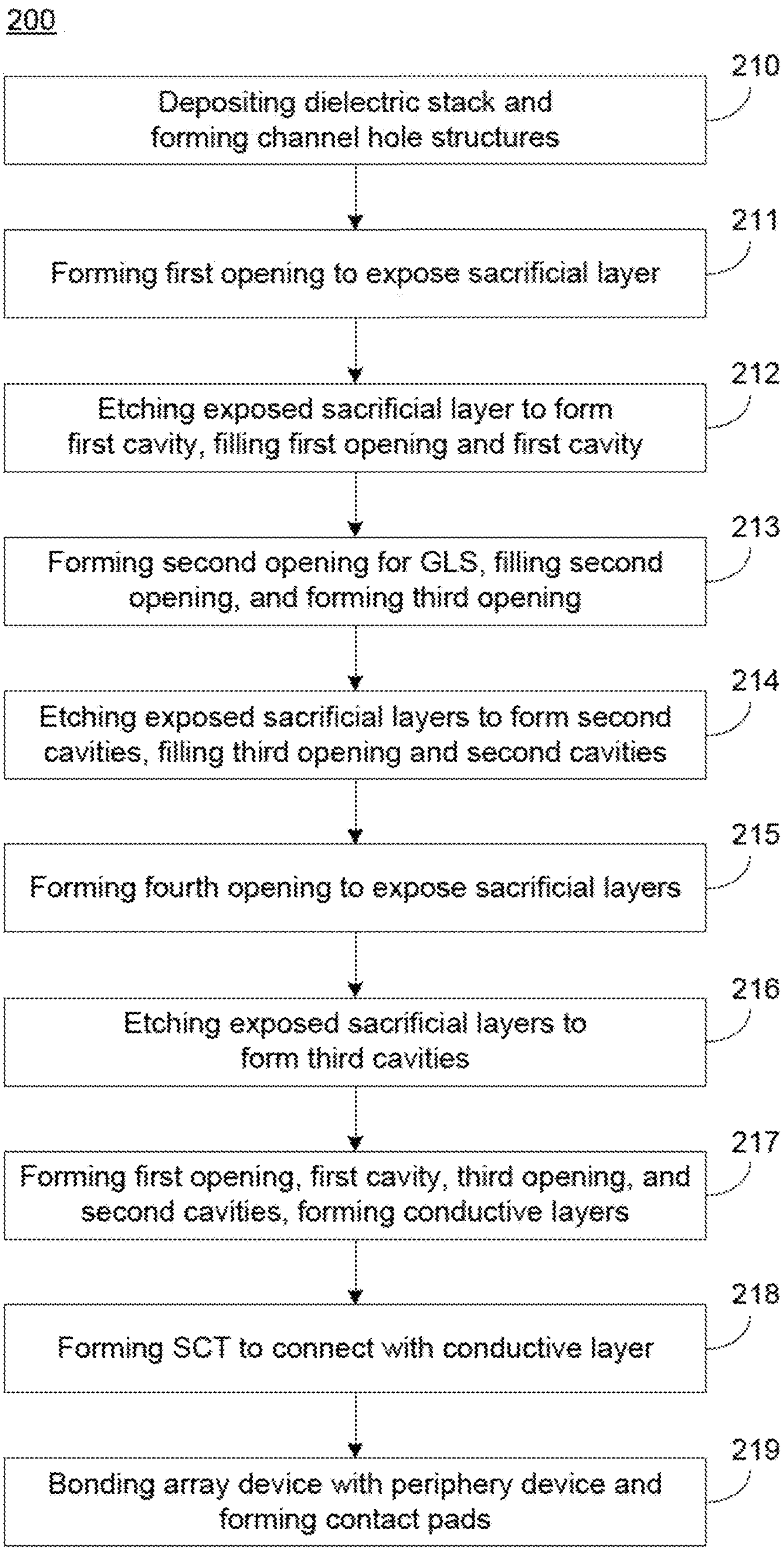
FIG. 32 illustrates a schematic flow chart of fabrication of a 3D memory device according to various aspects of the present disclosure.

FIG. 32 shows a schematic flow chart 200 for fabricating a 3D memory device according to aspects of the present disclosure. At 210, a substrate is provided for fabricating a 3D array device. In some aspects, multiple layers (e.g., silicon oxide layer and/or polysilicon layer) are deposited over the substrate. Further, a dielectric stack of the 3D array device is fabricated over the multiple layers. The dielectric stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer. Assuming that the first dielectric layer is silicon oxide, while the second dielectric layer is silicon nitride and used as the sacrificial layer.

Further, channel hole structures are formed that extend through the dielectric stack and the multiple layers. For example, channel holes are etched. A functional layer is deposited on the sidewall and bottom surface of each channel hole. The functional layer includes a blocking layer, a charge trap layer, and a tunneling layer that are deposited sequentially. Thereafter, a semiconductor channel is grown on a surface of the tunneling layer. The channel hole structure includes the functional layer and semiconductor layer.

At 211, a first opening is formed for an SCT in an SCT region. The first opening extends through a portion of the dielectric stack to expose a target first dielectric layer, i.e., a silicon oxide layer. CVD or ALD is performed to deposit silicon oxide on the sidewall and bottom of the first opening. An etch is conducted to etch the bottom of the first opening to expose a second dielectric layer underneath, that is, a sacrificial silicon nitride layer.

At 212, the exposed sacrificial layer is etched in a selective wet etch, creating a first cavity below the first opening and between two adjacent first dielectric layers. The selective wet etch is carried out for a predetermined etch time to control the depth of the first cavity. The first cavity and first opening are filled with a material such as polysilicon in a deposition process. A first filling structure is formed to fill the first opening and first cavity.

At 213, a second opening is formed for a GLS of the 3D array device. Along a direction vertical to the substrate, the second opening extends through the dielectric stack and the multiple layers between the dielectric stack and the substrate. The second opening extends through a first GLS region and a second GLS region horizontally. The first GLS region is close to the SCT region and dummy channel hole structures, while the second GLS region is close to channel hole structures. The dummy channel hole structures may provide mechanical support for the dielectric stack. When the multiple layers contain one or more polysilicon layers, an oxidation process is performed to oxidize the exposed polysilicon. The second opening is then filled with a material such as polysilicon by CVD and/or ALD. A second filling structure is formed in the second opening. Thereafter, a part of the second filling structure in the first GLS region is etched away to form a third opening. The third opening exposes second dielectric layers that are sacrificial silicon nitride layers on the sidewall.

At 214, the exposed sacrificial layers are etched to form second cavities in a selective wet etch. Each second cavity is between two adjacent first dielectric layers. The selective wet etch is performed for a predetermined etch time to control the depth of the second cavity. One of the second cavities exposes a part of the first filling structure, while rest of the second cavities is separated from the first filling structure by sections of the sacrificial layers. The third opening and second cavities are filled with a material such as polysilicon in a deposition process. A third filling structure is formed to fill the third opening and second cavities. The first and third filling structures contact each other through the exposed part of the first filling structure.

At 215, the remaining part of the second filling structure in the second GLS region is etched out to form a fourth opening. Along a direction vertical to the substrate, the fourth opening extends through the dielectric stack and the multiple layers between the dielectric stack and the substrate. The fourth opening exposes second dielectric layers that are sacrificial silicon nitride layers on the sidewall.

At 216, the exposed sacrificial layers are etched to form third cavities in a selective wet etch. Each third cavity is between two adjacent first dielectric layers. The selective wet etch is performed for a certain etch time to control the depth of the third cavities. The third cavities expose parts of the third filling structure, while the third cavities are separated from the first filling structure by sections of the sacrificial layers.

At 217, the first and third filling structures are etched away in one or more selective wet etches. The first opening and first cavity are recreated, so are the third opening and second cavities. Each second cavity merges with a corresponding third cavity on the same level with respect to the substrate. The first cavity, a second cavity on the same level, and a third cavity on the same level merge to form a combined cavity.

The first, second, and third cavities are filled with conductive materials to form conductive layers in a cavity filling process. The conductive layers may be referred to as word lines. The cavity filling process may include depositing a layer of a high-k dielectric material, a layer of TiN, and a metallic material (e.g., W) consecutively. The materials deposited in the cavity filling process, which may include the high-k dielectric material, TiN, and W, are removed from the sidewalls and bottoms of the first, third, and fourth openings by etch. The dielectric stack is transformed into a conductor/insulator stack.

At 218, a dielectric material (e.g., silicon oxide) is deposited on the sidewalls and bottom surfaces of the first, third, and fourth openings, followed by one or more depositions of polysilicon that fill these openings, respectively. The GLS is formed in the third and fourth openings. Optionally, CMP may be performed to flatten the top surface. Further, a silicon oxide layer is grown to cover the SCT and GLS regions on the top surface. The silicon oxide layer covering the SCT region is removed by etch. A selective etch process is carried out to respectively remove materials (e.g., polysilicon and silicon oxide) that fill the first opening. The first opening reappears. At the bottom of the first opening, the second dielectric layer and a conductive layer are exposed. The exposed conductive layer is formed in the combined cavity during the cavity filling process, and extends from the bottom of the first opening to the channel hole structures.

A conductive material, such as W, Co, Cu, or Al, is deposited on the sidewall and bottom of the first opening to form an SCT in the SCT region. The SCT electrically contacts the exposed conductive layer and thus is electrically connected with a word line. Optionally, a layer of TiN may be grown as a contact layer and/or barrier layer before depositing the conductive material to make the SCT. As such, the SCT is formed in the first opening and contains one or more layers made from conductive materials. In some aspects, the one or more layers of the SCT form a 3D pocket shape. The bottom of the pocket contacts a second dielectric layer, and the side of the pocket electrically contacts a conductive layer. The SCT or the pocket is filled with materials such as a dielectric material and polysilicon sequentially.

At 219, etching and deposition processes are performed to form other contacts including through silicon contacts that extend from the top surface towards the substrate. These contacts may be made of a conductive material such as W, Co, Cu, or Al. Further, silicon oxide is deposited to form a silicon oxide layer that covers the top surface. Openings are formed and filled in the silicon oxide layer to make vias. The vias may connect with the SCT, the channel hole structures, the through silicon contacts, etc. Thereafter, conductor layers, additional vias, and connecting pads are fabricated for the 3D array device.

Further, a flip-chip bonding process is performed to bond the 3D array device and a periphery device to create a 3D memory device. In some aspects, the 3D array device is flipped upside down and positioned above the periphery device. The connecting pads of the 3D array device and the periphery device are aligned and then bonded. After the substrate of the 3D array device is thinned, etching and deposition processes are performed to form vias, conductor layers, and contact pads for the 3D memory device. The contact pads are configured for wire bonding for connection with other devices.

As illustrated above, the conductor/insulator stack and GLS are made after some structures for the SCT are formed. A combined cavity for a conductive layer is created between an opening for the SCT and the channel hole structures. The conductive layer that extends between the opening for the SCT and the channel hole structures is grown in the combined cavity in one deposition. The fabrication process is relatively simple and has certain reliability and cost advantages.

Figure 33:
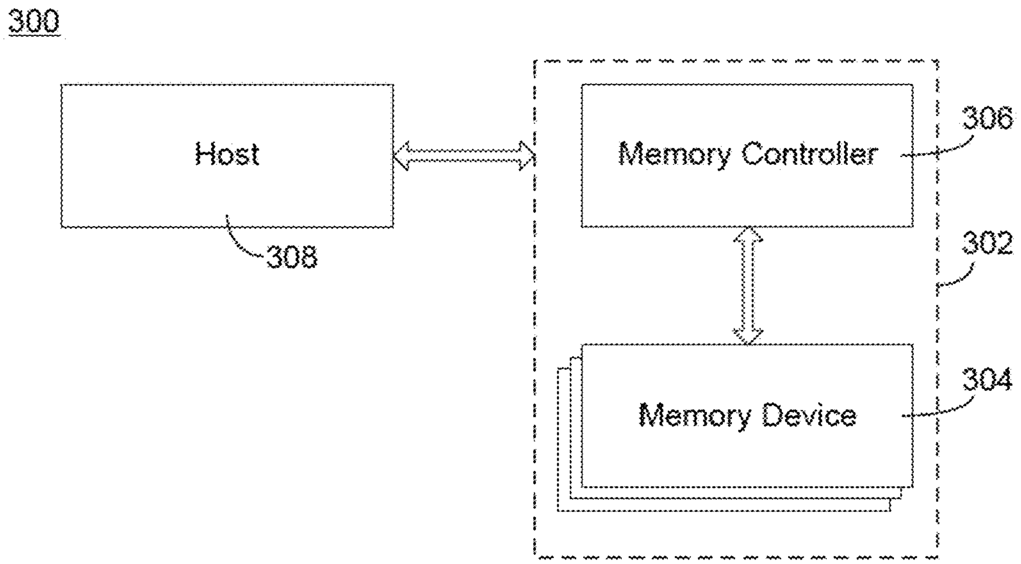
FIG. 33 illustrates a block diagram of an exemplary system having memory devices according to various embodiments of the present disclosure.

FIG. 33 shows a block diagram of an exemplary system 300 having a memory device according to various aspects of the present disclosure. The system 300 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 33, the system 300 may include a host 308 and a memory system 302 having one or more memory devices 304 and a memory controller 306. The host 308 may be a processor of an electronic device, such as a central processing unit (CPU), or a system-on-chip (SoC), such as an application processor (AP). The host 308 may be configured to send or receive data to or from the memory devices 304.

The memory controller 306 is coupled to the memory devices 304 and host 308 and is configured to control the memory devices 304, according to some implementations. The memory controller 306 may manage the data stored in the memory devices 304 and communicate with the host 308. In some embodiments, the memory controller 306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 306 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 306 may be configured to control operations of the memory device 304, such as read, erase, and program operations.

The memory controller 306 may also be configured to manage various functions with respect to the data stored or to be stored in the memory device 304 including, but not limited to bad-block management, garbage collection, logical-to-physical address conversion, wear leveling, etc. In some implementations, the memory controller 306 is further configured to process error correction codes (ECCs) with respect to the data read from or written to the memory device 304. Any other suitable functions may be performed by the memory controller 306 as well, for example, formatting the memory device 304. The memory controller 306 may communicate with an external device (e.g., the host 308) according to a particular communication protocol. For example, the memory controller 306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 304 may be any memory device disclosed in the present disclosure, such as the 3D memory device 190 shown in FIG. 31. As the 3D memory device 190 may have improved reliability and lower fabrication cost due to the reasons described above, when the device 190 is used, the system 300 may have improved reliability and lower cost, as well.

Figure 34:
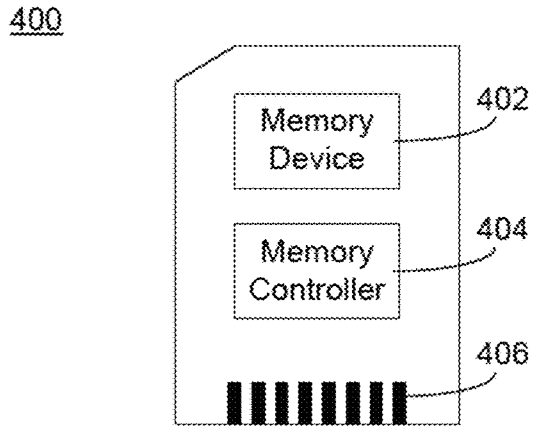
FIG. 34 illustrates a diagram of an exemplary memory card having a memory device, according to various aspects of the present disclosure.
Figure 35:
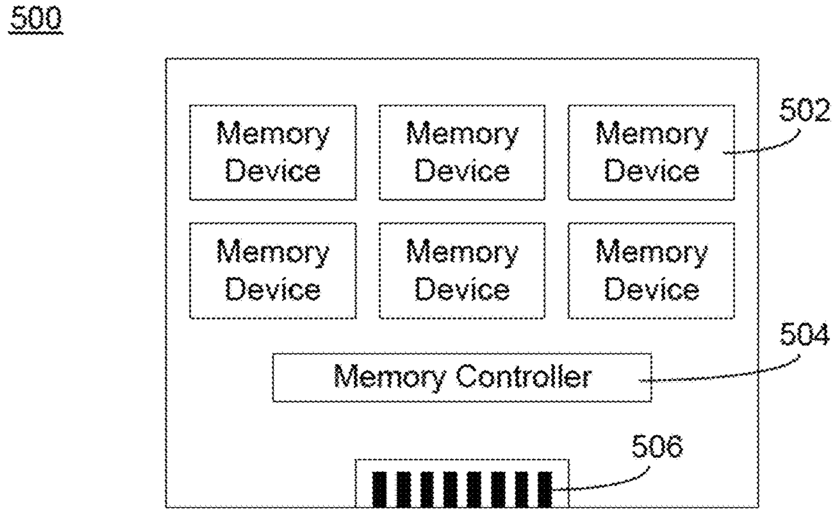
FIG. 35 illustrates a diagram of an exemplary solid-state drive (SSD) having memory devices, according to various aspects of the present disclosure.

The memory controller 306 and one or more memory devices 304 may be integrated into various types of storage devices, for example, be included in the same package, such as a universal Flash storage (UFS) package or an eMMC package. That is, the memory system 302 may be implemented and packaged into different types of end electronic products. FIGS. 32 and 33 exemplarily illustrate block diagrams of a memory card 400 and an SSD 500 according to various aspects of the present disclosure. As shown in FIG. 34, a memory controller 404 and a single memory device 402 may be integrated into the memory card 400. The memory device 402 may be any memory device illustrated above, such as the 3D memory device 190 shown in FIG. 31. The memory card 400 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. The memory card 400 may further include a memory card connector 406 configured to couple the memory card 400 to a host (e.g., the host 308 shown in FIG. 33). As shown in FIG. 35, a memory controller 504 and multiple memory devices 502 may be integrated into the SSD 500. The memory devices 502 may be any aforementioned memory device, such as the 3D memory device 190 shown in FIG. 31. The SSD 500 may further include an SSD connector 506 configured to couple the SSD 500 to a host (e.g., the host 308 shown in FIG. 33). In some embodiments, the storage capacity and/or the operation speed of the SSD 500 is greater than those of the memory card 400.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A three-dimensional (3D) memory device, comprising:

a conductor/insulator stack including a plurality of first conductive layers and a plurality of first dielectric layers alternatingly stacked;

a channel hole structure extending through the conductor/insulator stack;

a dielectric stack including the plurality of first dielectric layers and a plurality of second dielectric layers alternatingly stacked, wherein along a lateral direction, a second dielectric layer of the plurality of second dielectric layers extends along a first conductive layer of the plurality of the first conductive layers;

a plurality of second conductive layers, wherein a second conductive layer of the plurality of second conductive layers is formed through the second dielectric layer in the dielectric stack; and a plurality of staircase contacts (SCTs), wherein an SCT of the plurality of SCTs includes a conductive structure extending through the second conductive layer in the dielectric stack and electrically connected to the first conductive layer.

2. The 3D memory device according to claim 1, wherein a bottom of the conductive structure of the SCT is situated on an adjacent second dielectric layer of the plurality of first dielectric layers of the dielectric stack, and the adjacent second dielectric layer is under the second dielectric layer containing the second conductive layer.

3. The 3D memory device according to claim 1, wherein the SCT further includes a dielectric structure and the conductive structure surrounds the dielectric structure.

4. The 3D memory device according to claim 1, wherein orthographic projections of the plurality of second conductive layers on a plane along the lateral direction are non-overlapped.

5. The 3D memory device according to claim 1, wherein the channel hole structure includes:

a functional layer extending through the conductor/insulator stack, the functional layer including a blocking layer, a charge trap layer, and/or a tunnel insulation layer; and a semiconductor channel, the semiconductor channel extending through the conductor/insulator stack, and the functional layer being between the semiconductor channel and the conductor/insulator stack.

6. The 3D memory device according to claim 1, wherein in response to one or more layers of the dielectric stack being formed over the second dielectric layer containing the second conductive layer, the SCT extends through the one or more layers in an area of the dielectric stack free of any second conductive layer.

7. The 3D memory device according to claim 1, wherein the conductive structure of the SCT includes one or more SCT conductive layers surrounding a dielectric structure, and the one or more SCT conductive layers are between the second conductive layer and the dielectric structure.

8. A system, comprising:

a memory device; and a memory controller for controlling the memory device, the memory device comprising:

a conductor/insulator stack including a plurality of first conductive layers and a plurality of first dielectric layers alternatingly stacked;

a channel hole structure extending through the conductor/insulator stack;

a dielectric stack including the plurality of first dielectric layers and a plurality of second dielectric layers alternatingly stacked, wherein along a lateral direction, a second dielectric layer of the plurality of second dielectric layers extends along a first conductive layer of the plurality of the first conductive layers;

a plurality of second conductive layers, wherein a second conductive layer of the plurality of second conductive layers is formed through the second dielectric layer in the dielectric stack; and a plurality of staircase contacts (SCTs), wherein an SCT of the plurality of SCTs includes a conductive structure extending through the second conductive layer in the dielectric stack and electrically connected to the first conductive layer.

9. The system according to claim 8, wherein a bottom of the conductive structure of the SCT is situated on an adjacent second dielectric layer of the plurality of first dielectric layers of the dielectric stack, and the adjacent second dielectric layer is under the second dielectric layer containing the second conductive layer.

10. The system according to claim 8, wherein the SCT further includes a dielectric structure and the conductive structure surrounds the dielectric structure.

11. The system according to claim 8, wherein the first conductive layer extends from the SCT to the channel hole structure.

12. The system according to claim 8, wherein the conductive structure of the SCT includes one or more SCT conductive layers surrounding a dielectric structure, and the one or more SCT conductive layers are between the second conductive layer and the dielectric structure.

13. The 3D memory device according to claim 1, wherein sidewalls of the conductive structure of the SCT are in contact with portions of the second conductive layer.

14. The 3D memory device according to claim 1, wherein one second conductive layer of the plurality of second conductive layers is formed in one second dielectric layer of the plurality of second dielectric layers and corresponds to one first conductive layer of the plurality of first conductive layers.

15. The 3D memory device according to claim 1, wherein a sidewall of the conductive structure includes a recessed region for receiving a portion of the second conductive layer along the lateral direction.

16. The 3D memory device according to claim 3, wherein the dielectric structure includes a dielectric layer enclosing a void there-in.

17. The system according to claim 8, wherein the channel hole structure includes:

a functional layer extending through the conductor/insulator stack, the functional layer including a blocking layer, a charge trap layer, and/or a tunnel insulation layer; and a semiconductor channel, the semiconductor channel extending through the conductor/insulator stack, and the functional layer being between the semiconductor channel and the conductor/insulator stack.

18. The system according to claim 8, wherein in response to one or more layers of the dielectric stack being formed over the second dielectric layer containing the second conductive layer, the SCT extends through the one or more layers in an area of the dielectric stack free of any second conductive layer.

19. The system according to claim 8, wherein one second conductive layer of the plurality of second conductive layers is formed in one second dielectric layer of the plurality of second dielectric layers and corresponds to one first conductive layer of the plurality of first conductive layers.

20. The system according to claim 8, wherein a sidewall of the conductive structure of the SCT includes a recessed region for receiving a portion of the second conductive layer along the lateral direction.

* * * * *